United States Patent [19]

Kobayashi et al.

[11] Patent Number: 5,402,747
[45] Date of Patent: Apr. 4, 1995

[54] METHOD OF GROWING CRYSTAL

[75] Inventors: Sumio Kobayashi, Osaka; Shunji Miyahara, Itami; Toshiyuki Fujiwara, Kobe; Takayuki Kubo, Nishinomiya; Hideki Fujiwara, Amagasaki; Shuichi Inami, Nishinomiya; Masahiko Okui, Sanda, all of Japan

[73] Assignee: Sumitomo Metal Industries, Ltd., Osaka, Japan

[21] Appl. No.: 71,102

[22] Filed: Jun. 4, 1993

[30] Foreign Application Priority Data

Jun. 16, 1992 [JP] Japan .................................. 4-183263
Mar. 26, 1993 [JP] Japan .................................. 5-093759

[51] Int. Cl.⁶ .............................................. C30B 15/04
[52] U.S. Cl. ........................................ 117/15; 117/14; 117/19; 117/21; 117/932
[58] Field of Search ............... 156/605, 617.1, 619.1, 156/620.2, DIG. 64; 117/14, 15, 932, 19, 21

[56] References Cited

U.S. PATENT DOCUMENTS

| | | | |
|---|---|---|---|
| 2,904,512 | 9/1959 | Horn | 156/620.3 |
| 2,981,687 | 4/1961 | Parmee | 156/620.3 |
| 3,058,854 | 10/1962 | Angello | 156/620.3 |
| 4,133,969 | 1/1979 | Zumbrunner | 156/617.1 |

FOREIGN PATENT DOCUMENTS

| | | | |
|---|---|---|---|
| 4204777 | 10/1992 | Germany . | |
| 34-8242 | 9/1959 | Japan . | |
| 61-205691 | 9/1986 | Japan . | |
| 62-880 | 1/1987 | Japan . | |
| 63-252989 | 10/1988 | Japan . | |
| 2-80391 | 3/1990 | Japan . | |
| 02217393 | 8/1990 | Japan | 156/605 |
| 3-79320 | 12/1991 | Japan . | |
| 04144990 | 5/1992 | Japan | 156/605 |
| 04214091 | 8/1992 | Japan | 156/605 |

Primary Examiner—Robert Kunemund
Attorney, Agent, or Firm—Burns, Doane, Swecker & Mathis

[57] ABSTRACT

A single crystal material is filled in a crucible, and the whole of the single crystal material is melted to contain doping impurities. A solid layer coagulated upward from the bottom of the crucible is rendered to coexist with a melted layer over the solid layer. The solid layer is melted from the upper side thereof while pulling the single crystal from the melted layer. The ratio by weight between the solid layer and the single crystal material at the start of pulling is adjusted, together with the ratio by weight between the grown single crystal and the melting solid layer. The single crystal is thus grown while changing the volume of the melted layer.

12 Claims, 19 Drawing Sheets

Fig. 16

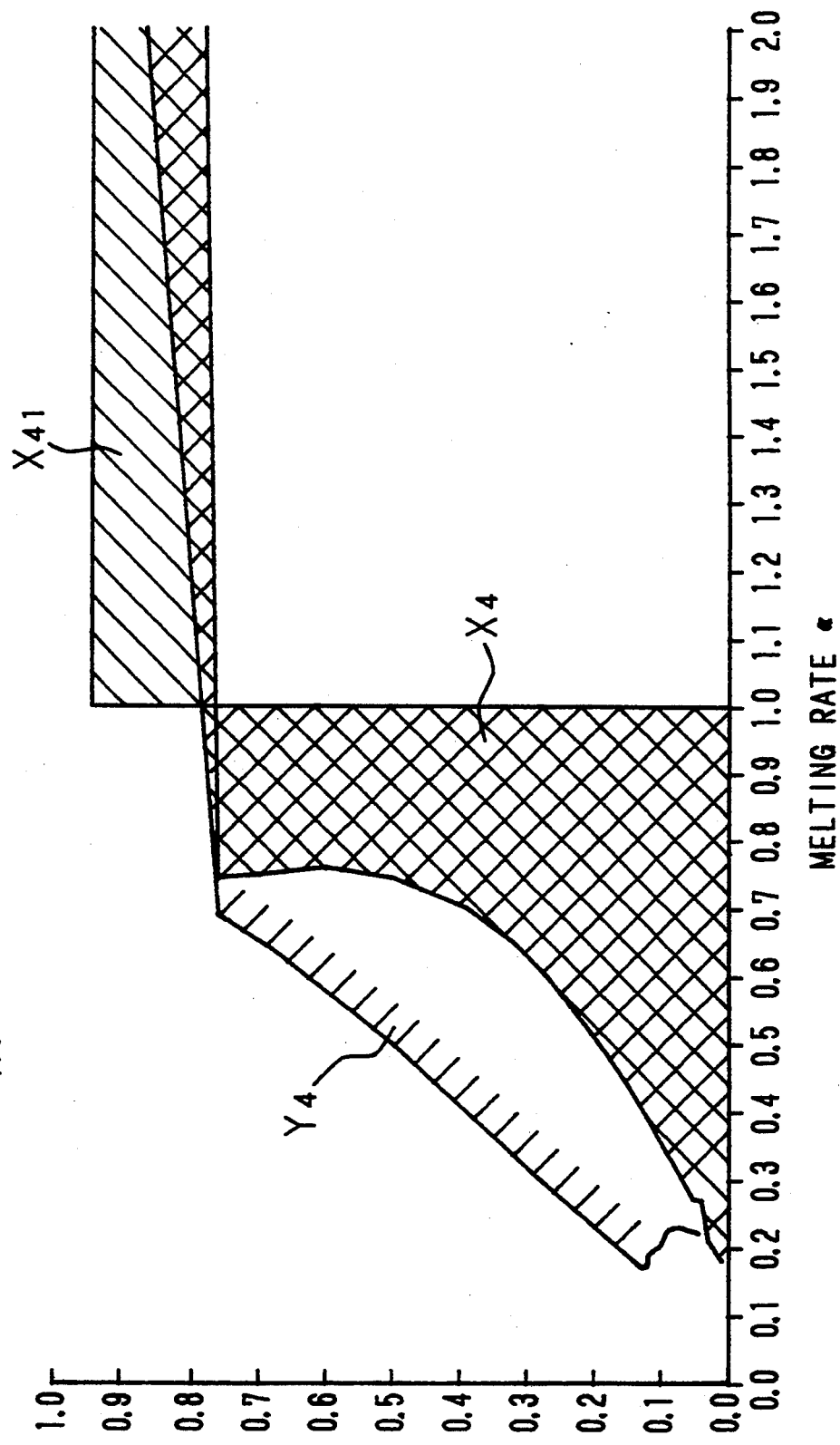

METHOD OF GROWING CRYSTAL

BACKGROUND OF THE INVENTION

1. Field of the Invention

The present invention relates to a method of growing crystal, or more in particular to a method of growing single crystal with doping impurities added thereto.

2. Description of Related Art

Various methods are available for growing single crystal. The Czochralski method (hereinafter referred to as "the CZ method") is an example. FIG. 1 is a schematic cross-sectional view of a conventional apparatus for growing single crystal according to the CZ method.

In FIG. 1, reference numeral 1 designates a crucible arranged in a chamber not shown. The crucible 1 includes a quartz inner case 1b in the shape of bottomed cylinder and an outer case 1a made of graphite fitted on the outside of the inner case 1b. A heater 2 is concentrically arranged on the outside of the crucible 1. The crystal material melted by the heater 2 is filled in the crucible 1 thereby to form a melted layer L. A seed crystal 4 suspended by a pulling wire 5 is immersed in the melted layer L. The seed crystal 4 is rotated while being pulled up, so that the melted material is coagulated at the lower end of the seed crystal 4, thus growing a single crystal 3.

In the case of growing the single crystal 3 by adding doping impurities (hereinafter referred to as "the dopant") in the melted layer L in this manner, the dopant is segregated along the direction of pulling up the single crystal 3 according to the Pfann equation shown by (1). In the process, the electrical resistivity of the single crystal 3 fails to be constant, and the product yield against the standard value of electrical resistivity is limited.

$$C_s = K_e \cdot C_c (1-f_s)^{k_e-1} \tag{1}$$

where ke is the effective segregation coefficient, Cs the dopant concentration in crystal, Cc the dopant concentration in the melted material at the start of pulling up crystal, and fs the crystal pulling ratio (the ratio of crystal weight to the weight of the crystal material used).

The melted layer method is well known for suppressing the segregation of the dopant. FIG. 2 is a schematic cross-sectional view of a conventional single crystal growing apparatus used for the melted layer method. The apparatus shown in the diagram is substantially similar to the one used for the CZ method shown in FIG. 1 except that in the apparatus shown in FIG. 2, the heater 2 is arranged concentrically on the outside of the upper part of the crucible 1. The same component parts in FIG. 2 as those in FIG. 1 are designated by corresponding reference numerals respectively, and will not be described again.

The crucible 1 is filled with a single crystal material. A solid layer S is coagulated upward from the bottom of the crucible 1, and the heater 2 is controlled in such a manner that the solid layer S as a lower layer coexists with the melted layer L as an upper layer in the crucible 1. The seed crystal 4, which is immersed in the melted layer L, is pulled up while melting the solid layer S at a fixed rate thereby to grow the single crystal 3.

This melted layer method is divided into a constant-thickness melted layer method and a variable-thickness melted layer method. The constant-thickness melted layer method is subdivided into two methods. One is a method disclosed in Japanese Patent Application Publication Nos. 34-8242 and 62-880, in which the solid layer S is formed without containing any dopant and is melted while the single crystal 3 is pulled up, and the amount of the dopant induced into the single crystal 3 is added continuously to the melted layer L while keeping constant the volume of the melted layer L, thereby maintaining the dopant concentration in the melted material constant. According to the other method, as disclosed in Japanese Patent Application Publication No. 62-880 and Japanese Patent Application Laid-Open No. 63-252989, the solid layer 3 containing the dopant is formed and is melted while pulling up the single crystal 3, and the dopant concentration in the melted material is kept constant by keeping the volume of the melted layer L constant without adding the dopant to the melted layer L while the single crystal 3 is pulled up.

In the variable-thickness melted layer method, on the other hand, the solid layer S is formed without containing any dopant and is melted while pulling up the single crystal 3, and the volume of the melted layer L is changed without adding the dopant to the melted layer L while the single crystal 3 is being pulled up, thereby maintaining the dopant concentration in the melted layer L at a fixed level (Japanese Patent Application Publication No. 3-79320).

The principle on which the segregation of the dopant is suppressed by the melted layer method will be explained. FIG. 3 is a one-dimensional model showing the relationship between the dopant concentration and the weight of the single crystal, the melted layer and the solid layer obtained when single crystal is grown by the melted layer method. The abscissa represents the phase ratio coordinate. It is assumed that the dopant has completely mixed in the melted material so that the dopant concentration in the melted material is uniform and there is no diffusion in the solid.

The starting condition of pulling up the single crystal is shown in FIG. 3(a). Characters fs, $f_L$ and fp designate the ratio by weight of the single crystal, the ratio by weight of the melted layer and the ratio by weight of the solid layer, respectively, to the material. Cs, $C_L$ and Cp represent the dopant concentration in the single crystal, the melted layer and the solid layer, respectively. The total weight Wd of the dopant under this condition is given by equation (2) below.

$$W_d = \int_0^{f_s} C_s(x)dx + C_L f_L + \int_{1-f_p}^{1} C_p(x)dx \tag{2}$$

$$f_s + f_L + f_p = 1 \tag{3}$$

FIG. 3(b) shows the single crystal as it is being pulled up. The pulling ratio of the single crystal changes to $f_s + \Delta f_s$, and the solid layer ratio to $f_p + \Delta f_p$. In the process, the melted layer ratio is $f_L - \Delta f_s - \Delta f_p$, leading to the relation $\Delta f_L = -\Delta f_s - \Delta f_p$. The total amount of dopant Wd under this condition is given by equation (4) below.

$$W_d = \int_0^{f_s + \Delta f_s} C_s(x)dx + (C_L + \Delta C_L)(f_L - \Delta f_s + \Delta f_p) + \tag{4}$$

-continued $$\int_{1-f_p-\Delta f_p}^{1} C_p(x)dx = W_d + C_a \Delta f_s$$

where $Ca\Delta f$ is the amount of dopant added, and $Ca$ the unit amount of dopant added against the crystal pulling ratio.

From equations (2) and (4) and the relation $\Delta f_L = -\Delta f_S - \Delta f_p$, equation (5) is obtained.

$$C_s(f_s)\Delta f_s + C_p(f_p)\Delta f_p + C_L\Delta f_L + \Delta C_L f_L = Ca\Delta f_s \quad (5)$$

where $C_p(1-f_p)$ is represented by $C_p(f_p)$. Equation (5) is expressed in differential form by equation (6).

$$C_s + C_p \frac{df_p}{df_s} + C_L \frac{df_L}{df_s} + f_L \frac{dC_L}{df_s} = Ca \quad (6)$$

Assuming that local growth is established in the growth boundary of a solid, equations (7) and (8) hold in the process of single crystal growth.

Dopant concentration in single crystal $$C_s = k_e \cdot C_L \cdot \Delta f_s > 0 \quad (7)$$

Dopant concentration in solid layer $$C_p = k_e \cdot C_L \cdot \Delta f_p > 0 \quad (8)$$

In the case where the solid layer is melted ($\Delta f_p > 0$) while pulling up the single crystal ($f_s > 0$), equation (6) may be converted to equations (9A) and (9B) shown below. Equation (9A) indicates the case in which a solid layer exists, and equation (9B) in which the solid layer is melted entirely.

$$C_L\left(k_e + \frac{df_L}{df_s}\right) + C_p \frac{df_p}{df_s} + f_L \frac{dC_L}{df_s} = Ca : f_p > 0 \quad (9A)$$

$$C_L\left(k_e + \frac{df_L}{df_s}\right) + f_L \frac{dC_L}{df_s} = Ca : f_p = 0 \quad (9B)$$

The melting rate of the solid layer during the process of pulling up the single crystal depends on the internal thermal design of the pulling device. Since the melting rate is normally fixed, however, the melting rate $\alpha$ is assumed to be given by equation (10).

$$df_p/df_s = -\alpha < 0 \quad (10)$$

Under this condition, the solid layer ratio $f_p$ and the melted layer ratio $f_L$ are expressed respectively as Solid layer ratio $f_p = f_{p0} - \alpha \cdot f_s \quad (11)$ ($f_{p0}$: solid layer ratio at the start of pulling the single crystal), and $$\begin{aligned}\text{Melted layer ratio } f_L &= 1 - f_p - f_s \\ &= 1 - f_{p0} + (\alpha - 1) f_s\end{aligned} \quad (12)$$

Equation (13) is obtained from equation (12).

$$\frac{df_L}{df_s} = -\frac{df_p}{df_s} - 1 = \begin{cases} \alpha - 1 & : f_s \leq f_{p0}/\alpha \\ -1 & : f_s > f_{p0}/\alpha \end{cases} \quad (13)$$

Equation (14A) and (14B) are introduced from equations (9) and (13)

$$C_L(k_e - 1 + \alpha) - \alpha C_p + \quad (14A)$$

$$\{1 - f_{p0} + (\alpha - 1)f_s\}\frac{dC_L}{df_s} = Ca : f_s \leq f_{p0}/\alpha$$

$$C_L(k_e - 1) + (1 - f_s)\frac{dC_L}{df_s} = Ca : f_s > f_{p0}/\alpha \quad (14B)$$

Equation (14A) shows the case in which a solid layer exists, and equation (14B) the condition after the solid layer is completely melted, which describes the dopant concentration in the melted material.

Single crystal is grown according to the melted layer method either by containing the dopant in the solid layer or by preventing the dopant from being contained in the solid layer.

First, in the method having no dopant contained in the solid layer, $C_p = 0$, and therefore equation (14A) is replaced by equation (15)

$$C_L(k_e - 1 + \alpha) + \{1 - f_{p0} + (\alpha - 1)f_s\}\frac{dC_L}{df_s} = Ca \quad (15)$$

The condition required to prevent segregation of dopant is $dC_L/df_s = 0$. Therefore, equation (16) is introduced from equation (15).

$$C_L(k_e - 1 + \alpha) = Ca \quad (16)$$

In the constant-thickness melted layer method, $\alpha = 1$. Equation (17) shown below thus constitutes the condition for no segregation.

$$Ca = k_e \cdot C_L = k_e \cdot Cb \quad (17)$$

where $Cb$ is the dopant concentration in the melted material at the start of pulling the crystal.

Since $Ca = 0$ according to the variable-thickness melted layer method, on the other hand, equation (18) below gives the condition for no segregation.

$$\alpha = 1 - k_e \quad (18)$$

In either case, the single crystal is segregated according to equation (14B) after the solid layer is completely melted.

In the method with the dopant contained in the solid layer, by contrast, the single crystal material filled in the crucible1 is all melted. The dopant is added to attain uniformity, after which the melted material is coagulated upward from the bottom of the crucible thereby to form a solid layer. Under this condition, the dopant concentration in the solid layer is expressed by equation (19) below.

$$C_p = k_e \cdot C_o(1 - f_p)^{k_e - 1} 1 \quad (19)$$

where $Co$ is the dopant concentration in the melted material before the solid layer is formed.

The dopant concentration in the melted material at the start of pulling the single crystal is expressed by equation (20).

$$Cb = Co(1 - f_{p0})^{ke-1} \quad (20)$$

According to the method in which the dopant is contained in the solid layer, no dopant is added to the melted material and therefore Ca=0. Also, a=1 in the constant-thickness melted layer method. Equation (21) is thus obtained from equations (19) and (14A).

$$(1 - f_{p0})\frac{dC_L}{df_s} + ke \cdot C_L = ke \cdot C_0 \{1 - (f_p - f_s)\}^{ke-1} \quad (21)$$

Equation (21) is modified, leading to equation (22).

$$C_L = C_b \exp\left(-\frac{ke}{1-f_{p0}} f_s\right) \cdot \left[\int_0^{f_s} \frac{ke\left(1 + \frac{f_s}{1-f_{p0}}\right)^{ke-1}}{(1-f_{p0}) \exp\left(-\frac{ke}{1-f_{p0}} f_s\right)} df_s + 1\right] \quad (22)$$

Equation (22) thus introduced is descriptive of the change in dopant concentration according to the constant-thickness melted layer method in which the dopant is contained in the solid layer. This descriptive equation is solved by numerical integration. FIG. 4 is a graph showing the change of dopant concentration in the melted material normalized by the dopant concentration in the melted material at the start of pulling the crystal, as obtained by pulling up the single crystal by the numerical integration. The abscissa represents the single crystal pulling ratio fs, and the ordinate the dopant concentration $C_L/Cb$ normalized by the dopant concentration in the melted material at the start of pulling the crystal. Character A indicates the dopant concentration with the solid layer ratio $f_{p0}$ of 0.7 at the start of pulling and the effective segregation coefficient ke of 0.8. Character B designates the change in dopant concentration according to the CZ method. In the case where the dopant is contained in the solid layer according to the constant-thickness melted layer method, it is seen from FIG. 4 that the change in dopant concentration is suppressed as compared with the CZ method although the condition for no segregation is lacking as described above.

In the melted layer methods for growing the single crystal 3 such as silicon by the use of the single crystal growing apparatus shown in FIG. 2, polycrystal is often formed while the single crystal 3 is being pulled up. In the such a case, the single crystal 3 is pulled up through the remelt process of melting the polycrystalized crystal completely into the melted material.

The method in which the dopant is prevented from being contained in the solid layer S according to the melted layer methods through the remelt process (as disclosed in Japanese Patent Application Publication Nos. 34-8242, 62-880 and 3-79320) has the disadvantage that the dopant is undesirably incorporated again into the solid layer S formed as the single crystal 3 is pulled up, thereby making it impossible to obtain a single crystal of the desired dopant concentration.

In the case of the constant-thickness melted layer method for forming the solid layer S with the dopant contained therein, by contrast, the remelt process, if employed, causes no inconvenience since the solid layer S formed when the single crystal 3 is pulled up again assumes a state substantially similar to the initial solid layer S.

Nevertheless, according to the constant-thickness melted layer method in which the solid layer S is formed with the dopant contained therein, the concentration change by the pulling up of the single crystal increases with the decrease in the effective segregation coefficient ke below unity. FIG. 5 is a graph showing the change of the dopant concentration in the melted material with the pulling up of the single crystal when the single crystal is grown by the constant-thickness melted layer method with the solid layer containing the dopant. The abscissa represents the pulling ratio of the single crystal, and the ordinate the dopant concentration $C_L/Cb$ of the melted material while the single crystal is being pulled up as against the dopant concentration in the melted material at the start of pulling up. In FIG. 5, character A designates the change in dopant concentration for the solid layer ratio $f_{p0}$ of 0.7 at the start of pulling and the effective segregation coefficient ke of 0.8 in equation (22), and character C the change in dopant concentration for the solid layer ratio $fP_0$ of 0.7 at the start of pulling and the effective segregation coefficient ke of 0.35.

As obvious from the graph, the dopant concentration change C is greater than the dopant concentration change A. It will therefore be seen that the change in dopant concentration in the melted material with the puling up of the single crystal increases according as the effective segregation coefficient ke decreases below unity. In the case where the change in dopant concentration in the melted material is considerable, as in the case described above, the dopant concentration of the growing single crystal undergoes a change, thereby leading to the problem that a single crystal of the desired electrical resistivity is not obtainable as the single crystal is pulled up.

As shown in FIG. 2, since the silicon melted material is filled in the quartz inner case 1b of the crucible 1, part of the quartz ($SiO_2$) in contact with the melted material is diffused into the melted layer L. The quartz thus diffused into the melted layer L reacts with the melted material, and the resulting material is partly gasified into silicon oxide, which may reach and attach in the form of solid silicon to the outer wall of the outer case 1a of the crucible 1. In the case where the oxide reaches the heater 2 of resistance heating type made of graphite, on the other hand, CO gas is generated as a result of reaction with graphite and acts to deform the heater 2.

The same silicon single crystal may alternatively be grown under different heating powers of the heater 2 by regulating the heat-insulating material of the heat shield arranged outside of the heater 2 in order to adjust the other qualities required of a single crystal including the oxygen concentration.

In the case where the surface of the heater 2 or the crucible 1 undergoes a secular variation or the single crystal is grown under different heating powers of the heater, as described above, the solid layer ratio at the start of pulling $f_{p0}$ is subjected to variations and the desired solid layer ratio $f_{p0}$ cannot be obtained even when other conditions for pulling up the crystal remain unchanged. To the extent that the solid layer ratio $f_{p0}$ is varied at the start of pulling, the dopant concentration in the melted layer L undergoes variations correspondingly. Assuming that phosphorus is added as a dopant with the desired solid layer ratio $f_{p0}$ of 0.5 at the start of pulling and the actual solid layer ratio $f_{p0}$ of 0.55 at the start of pulling, for instance, the dopant concentration in the melted layer L is 1.07 times larger than the desired value.

In this way, variations in the solid layer ratio at the start of pulling $f_{p0}$ causes variations in dopant concentration in the melted layer L and hence variations in the electrical resistivity of a grown single crystal. As a result, the problem of a reduced yield of the single crystal is posed.

SUMMARY OF THE INVENTION

An object of the invention is to provide a method of growing crystal in which the change in dopant concentration in a melted material is suppressed without causing any deviation of the dopant concentration in the single crystal by the remelt process.

Another object of the invention is to provide a method of growing crystal in which the change of phosphorus concentration in a melted material is reduced to permit high-yield growth of silicon single crystal.

Still another object of the invention is to provide a method of growing crystal in which the change of phosphorus concentration in a melted material is reduced to permit high-yield growth of silicon single crystal even when the solid layer ratio is varied at the start of pulling up.

According to the invention, there is provided a method for growing crystal in which a single crystal material is filled in a crucible, all the single crystal material is melted to contain doping impurities, a solid layer coagulated upward from the crucible bottom is rendered to co-exist with a melted layer formed thereon, and single crystal is grown by being pulled up from the melted layer as the solid layer is melted downward from the top by a heater arranged around the crucible while at the same time changing the volume of the melted layer.

In the case where single crystal is grown with the dopant contained in a solid layer as according to the conventional constant-thickness melted layer method, the dopant concentration in the melted material decreases as the single crystal is pulled up, as shown in FIGS. 4 and 5. This is due to the fact that the melted material is diluted by the melting of the solid layer more extensively than the segregation of the single crystal is suppressed by the melting of the solid layer. In order to prevent excessive dilution of the melted layer, the solid layer may be rendered to contain the dopant and the melted material ratio may be adjusted without adding the dopant while the single crystal is being pulled up, with the result that the dopant concentration in the melted material is successfully fixed.

In a manner similar to the introduction of equation (22) providing a descriptive equation representing the change in dopant concentration according to the constant-thickness melted layer method with the dopant contained in the solid layer, equation (23) is obtained providing a descriptive equation indicating the change in dopant concentration according to the variable-thickness melted layer method with the dopant contained in the solid layer from equations (19) and (14A). In the process, the melting rate $a \neq 1$ since the variable-thickness melted layer method is involved, and $C_a = 0$ in view of the fact that the dopant is not added while the single crystal is being pulled up.

$$C_L = C_b \left( -\frac{1-a}{1-f_{p0}} f_s \right)^{\frac{ke-1+a}{1-a}} \quad (23)$$

$$\left[ \int_0^{f_s} \frac{a \cdot Ke \left(1 + \frac{a \cdot f_s}{1-f_{p0}}\right)^{ke-1}}{(1-f_{p0})\left(1 - \frac{1-a}{1-f_{p0}} f_s\right)^{\frac{ke}{1-a}}} df_s + 1 \right]$$

FIGS. 6, 7 and 8 are graphs in which the change in dopant concentration is determined by numerical integration of equation (23) with the effective segregation coefficient $ke$ at 0.35 and the solid layer ratios at the start of pulling $f_{p0}$ at 0.6, 0.7 and 0.8, respectively. The abscissa represents the pulling ratio $f_s$ of the single crystal, and the ordinate the ratio $C_L/C_b$ of dopant concentration in the melted material while the crystal is being pulled up as against the dopant concentration in the melted material at the start of pulling. The melting rate is set in 0.05 increments with $a$ in the range of 0.50 to 1.00. The effective segregation coefficient $ke = 0.35$ is the one for phosphorus widely used as a dopant for silicon single crystal. In each diagram, the melting rate $a$ of 1.00 represents the one used for the constant-thickness melted layer method, and the curve broken midway means that the melted layer is exhausted and the pulling operation is suspended.

As apparent from these diagrams, the melting rate $a$ associated with the least change of dopant concentration in the melted material is 0.9 for the solid layer ratio $f_{p0}$ of 0.6 at the start of pulling (FIG. 6), and 0.85 for the solid layer ratio $f_{p0}$ of 0.7 at the start of pulling (FIG. 7), and 0.8 for the solid layer ratio $f_{p0}$ of 0.8 at the start of pulling (FIG. 8). In these cases, it is seen that the change of dopant concentration in the melted material is suppressed more than in the constant-thickness melted layer method with no dopant contained in the solid layer.

As will be understood from the foregoing description, according to the method of growing crystal of the invention, the melted layer method with containing the dopant in the solid layer is used to grow single crystal while changing the volume of the melted layer, and the melting rate $a$ and the solid layer ratio at the start of pulling $f_{p0}$ against the single crystal material are determined on the basis of the descriptive equation of the change in dopant concentration according to the variable-thickness melted layer method with the dopant contained in the solid layer, whereby the change of dopant concentration in the melted material is suppressed.

The yield of silicon single crystal is determined with the silicon crystal grown in accordance with the melting rate $a$ and the solid layer ratio at the start of pulling $f_{p0}$ with phosphorus as a dopant. In this manner, the range of the melting rate $a$ and the solid layer ratio at the start of pulling $f_{p0}$ are determined for a method superior in yield to the CZ method and the constant-thickness melted layer method.

Specifically, $f_{p0}$ and $a$ meet the following conditions (I) or (II):

$$0 < f_{p0} < 0.85 \quad \text{(I)}$$

-continued
$$fp_0 < 14.9\alpha^4 - 18.3\alpha^3 + 7.98\alpha^2 - 0.90\alpha + 0.08$$
$$0 < \alpha < 1$$
$$0 < fp_0 < 0.85$$
$$fp_0 < 136.27\alpha^2 - 263.28\alpha^4 + 191.07\alpha^3 - 62.46\alpha^2 + 9.26\alpha - 0.42 \quad \text{(II)}$$
$$0 < \alpha < 1$$

Many silicon single crystals used as a semiconductor material have lower and upper limits of allowable range (standard value) of electrical resistivity in the ratio of 1 to 1.3 or 0.7 to 1. In the case where the ratio is 1 to 1.3, for instance, the allowable range is set at 10 to 13 Ωcm. The electrical resistivity of single crystal and the dopant concentration in the single crystal are inversely proportional to each other. In view of the fact that the effective segregation coefficient ke remains unchanged during the pulling of crystal in the case of ordinary growth of single crystal, the electrical resistivity of single crystal and the dopant concentration in the melted material are also inversely proportional to each other. As a result, the lower and upper limits of the allowable range of the dopant concentration in the melted material is considered in the ratio of 1 to 1.3 or 0.7 to 1. The condition (I) indicates the range of $\alpha$ and $fp_0$ for the ratio of 0.7 to 1, and the condition (II) the range of $\alpha$ and $fp_0$ for the ratio of 1 to 1.3.

When single crystal actually starts to be pulled up, however, the secular change in heat supply of the heater, for example, causes variations in solid layer ratio. Direct measurement of the thickness of the solid layer and the calculation based on the resistivity in initial stages of growth of silicon single crystal show that the variation is not more than ±0.05 and the solid layer ratio at the start of pulling is seen to be $fp_0 \pm 0.05$.

Consequently, the yield of silicon single crystal grown with phosphorus as a dopant in accordance with the solid layer ratio at the start of pulling $fp_0$ and the melting rate $\alpha$ is determined taking into consideration the variation of $fp_0 \pm 0.05$ in the solid layer ratio $fp_0$ at the start of pulling, whereby such a range of the solid layer ratio at the start of pulling $fp_0$ and the melting rate $\alpha$ which produces a higher yield than the CZ method or constant-thickness melted layer method is defined.

Specifically, the values $fp_0$ and $\alpha$ satisfy the conditions (III) or (IV) when taking into consideration the variation of ±0.05 of the solid layer ratio at the start of pulling $fp_0$.

$$0 < fp_0 < 0.65 - \{(\alpha - 3.1187)^2 - 5.6104\}^{\frac{1}{2}}/8.1455^{\frac{1}{2}} \quad \text{(III)}$$
and
$$0 < \alpha < 0.75$$
or
$$0 < fp_0 < 0.8$$
and
$$0.75 \leq \alpha < 1$$
$$0 < fp_0 < 0.635 - \{2.5975 - (\alpha + 0.83165)^2\}^{\frac{1}{2}}/4.1002^{\frac{1}{2}} \quad \text{(IV)}$$
and
$$0 < \alpha < 0.78$$
or
$$0 < fp_0 < 0.77$$
and
$$0.78 \leq \alpha < 1$$

FIG. 9 is a graph for determining the change in dopant concentration by numerical integration of equation (23) for the effective segregation coefficient ke of 0.35, the melting rate $\alpha$ of 0.75 and a target solid layer ratio at the start of pulling $fp_0$ of 0.6. The abscissa represents the pulling ratio fs of single crystal, and the ordinate the ratio $C_L/C_b$ of the dopant concentration of the melted material during the pulling operation to the dopant concentration in the melted material at the start of pulling. Characters D, E and F indicate curves plotted, taking into account the variation ±0.05 of the solid layer ratio at the start of pulling $fp_0$, for different cases of $fp_0$ at 0.55, 0.6 and 0.65, respectively.

In calculating the maximum yield of a grown single crystal shown in FIG. 9 within the variation range of ±0.05 of the solid layer ratio at the start of pulling $fp_0$ with the lower and upper limits of the allowable range of dopant concentration in the melted material in the ratio of 0.7 to 1, which curve E, D or F has a minimum yield in the allowable range of phosphorus concentration from 0.7 Cd to Cd (Cd: allowable upper limit of phosphorus concentration in melted material) is first determined. As clear from the diagram, the yield is minimum for curve E when the solid layer ratio at the start of pulling $fp_0 \pm \Delta fp_0$ is 0.55. The next process is to determine the melting rate $\alpha$ of the solid layer and the solid layer ratio at the start of pulling $fp_0$ providing the maximum yield of the grown single crystal in the case of E. The resulting yield is the maximum one obtainable when taking the variation of ±0.05 of the solid layer ratio at the start of pulling $fp_0$ into consideration. Such a maximum yield is shown by equation (24).

$$\max_{Cd} \left( \min B(Cd, fp_0 \pm \Delta fp_0) \atop \Delta fp_0 \right) \quad (24)$$

where B is a yield.

On the other hand, the maximum yield with the lower and upper limits of the allowable range of dopant concentration in the melted material in the ratio of 1 to 1.3 within the range of the variation ±0.05 of the solid layer ratio at the start of pulling $fp_0$, is determined in similar fashion and is shown by equation (25), $$\max_{Ce} \left( \min B(Ce, fp_0 \pm \Delta fp_0) \atop \Delta fp_0 \right) \quad (25)$$

where Ce is the phosphorus concentration in the melted material at the allowable upper limit, and B is a yield.

The condition (III) represents the range of $\alpha$ and $fp_0$ when taking into consideration the solid layer ratio at the start of pulling with the lower and upper limits of the allowable range of dopant concentration in the melted material in the ratio of 0.7 to 1, and the condition (IV) the range of $\alpha$ and $fp_0$ when taking into consideration the solid layer ratio at the start of pulling with the lower and upper limits in the ratio of 1 to 1.3.

A method of growing crystal according to the invention, which is a variable-thickness melted layer method with the dopant contained in the solid layer, is capable of suppressing the change of dopant concentration in a melted material without causing any deviation of the dopant concentration in single crystal during the remelt process. Also, the silicon single crystal to be doped with phosphorus can be grown with a higher yield than in the constant-thickness melted layer method by reducing the change in phosphorus concentration in the melted material. Further, even when the solid layer ratio at the start of pulling undergoes variations, silicon single crystal is grown with high yield by reducing the change of phosphorus concentration in the melted material.

The above and further objects and features of the invention will more fully be apparent from the following detailed description with accompanying drawings.

BRIEF DESCRIPTION OF THE DRAWINGS

FIG. 16 is a diagram for explaining the yield with silicon single crystal grown as shown by Example 1 of Embodiment 3.

FIG. 19 is a graph showing the region where the yield is higher than in the constant-thickness melted layer method in Example 2 of Embodiment 3.

DESCRIPTION OF THE PREFERRED EMBODIMENTS

The invention will be described in detail below with reference to the drawings showing embodiments.

[Embodiment 1]

Figure 1:
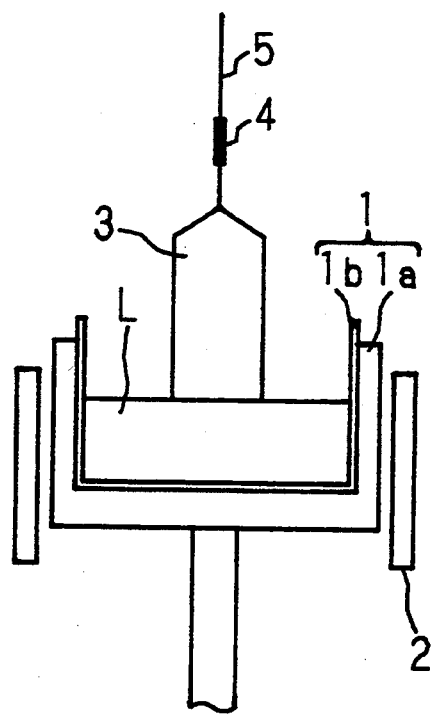
FIG. 1 is a schematic cross-sectional view of a conventional single crystal growing apparatus used for the CZ method.
Figure 2:
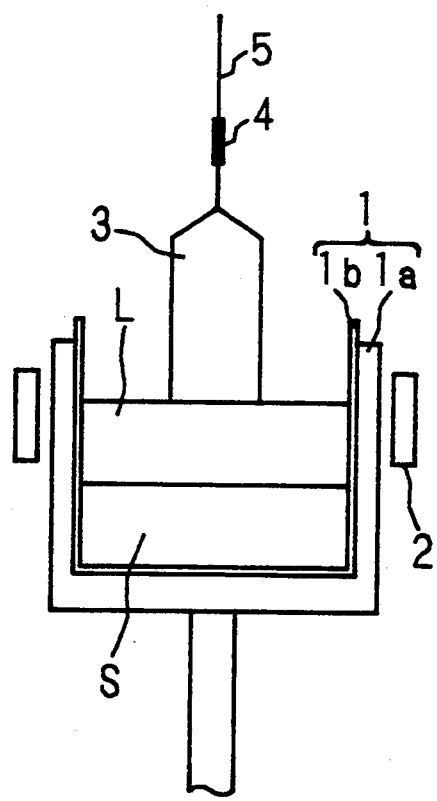
FIG. 2 is a schematic cross-sectional view of a conventional single crystal growing apparatus used for the melted layer method.
Figures 3A, 3B:
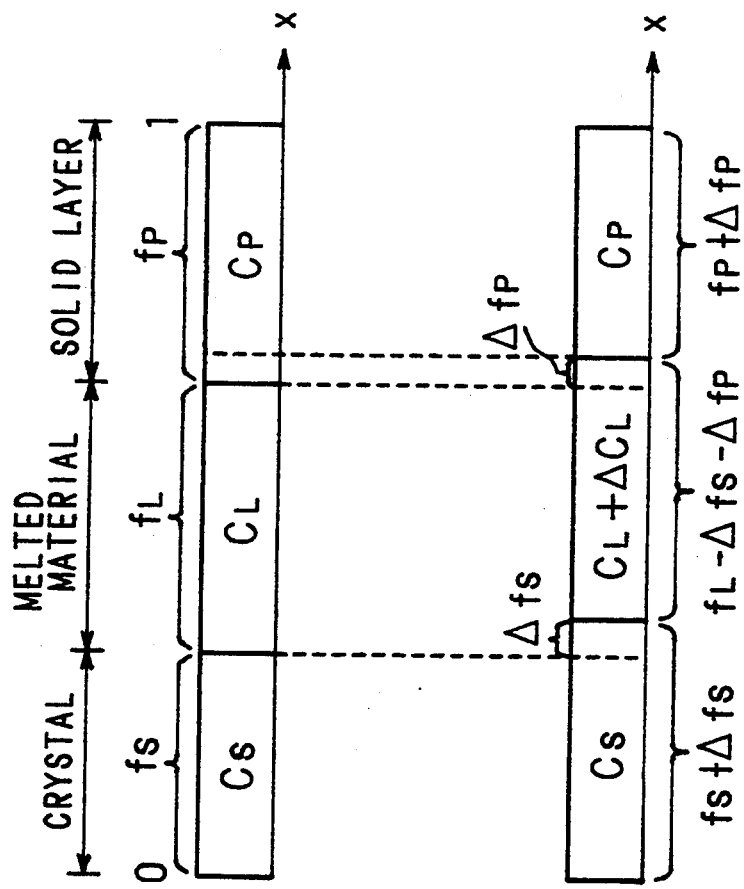
FIG. 3 (a) and FIG. 3 (b) are one-dimensional models showing the relationship between the weights of the single crystal, the melted layer and the solid layer on the one hand and the dopant concentration on the other hand in the conventional melted layer method.
Figure 4:
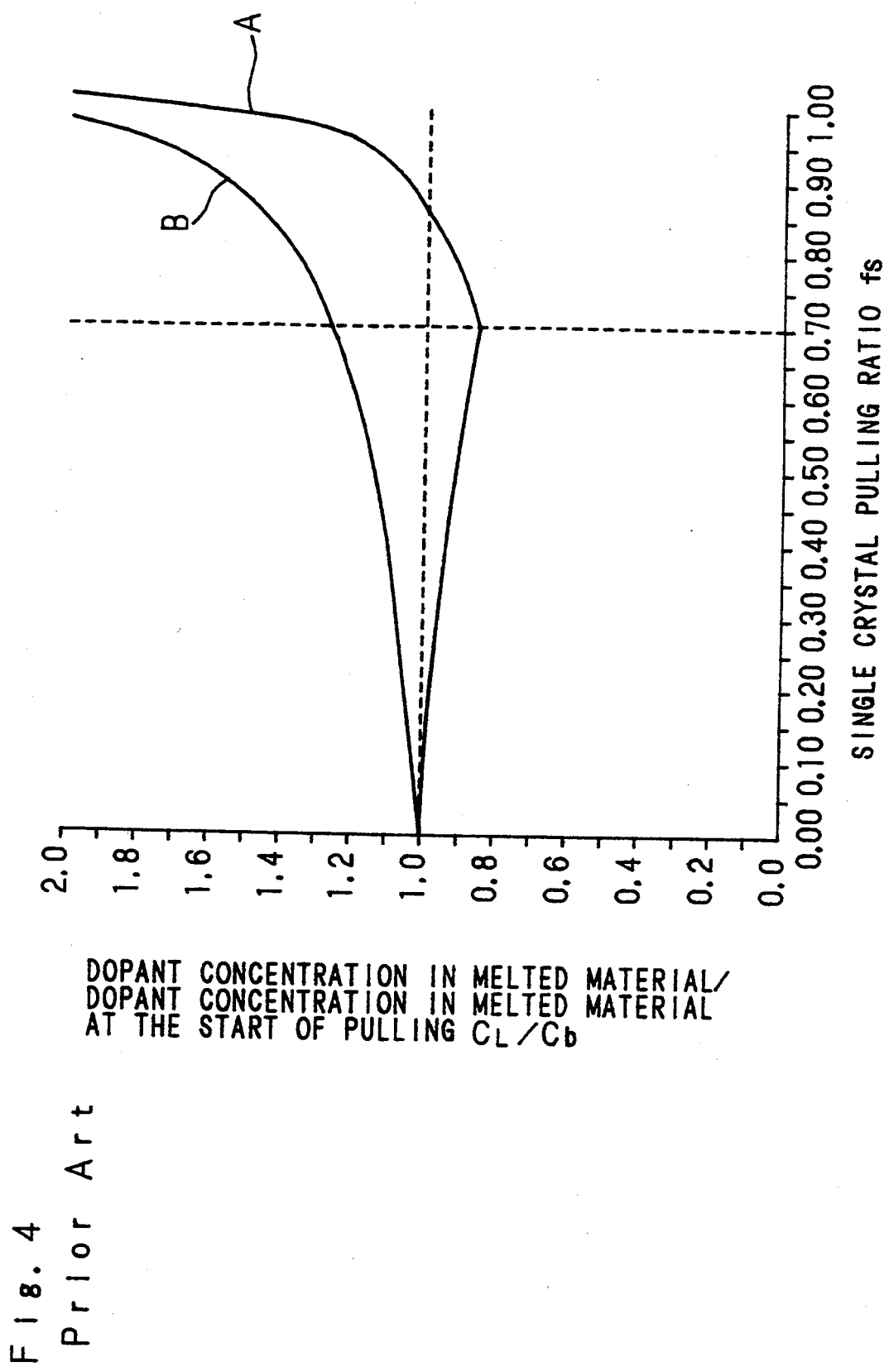
FIG. 4 is a graph showing a descriptive equation of the change in dopant concentration according to the conventional method for growing single crystal.
Figure 5:
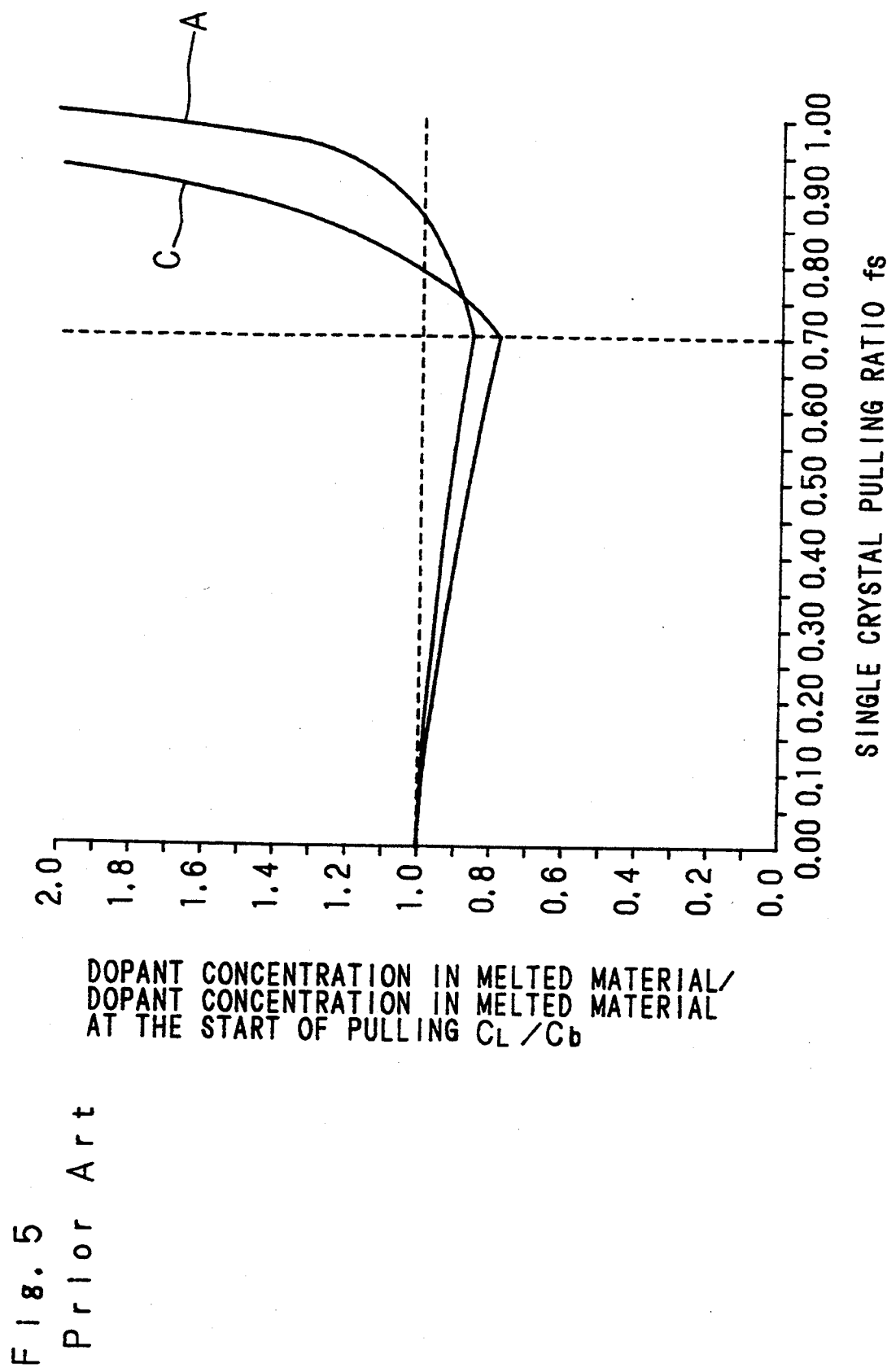
FIG. 5 is a graph showing the change in dopant concentration in the melted material that occurs as the single crystal is pulled up to grow single crystal by the conventional melted layer method with the dopant contained in a solid layer.
Figure 6:
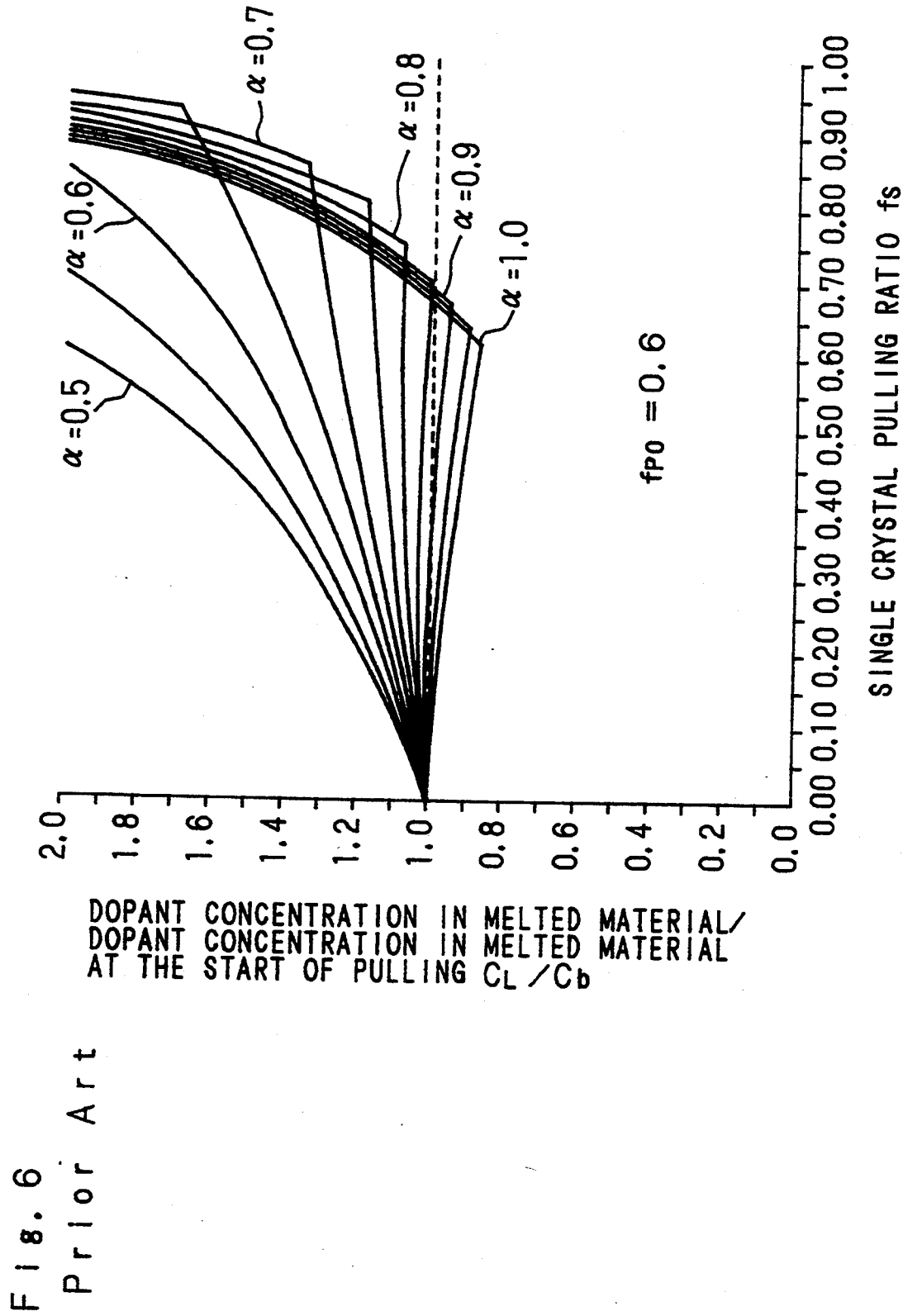
FIG. 6 is a graph for determining the change in dopant concentration when $ke=0.35$ and $f_{p0}=0.6$.
Figure 7:
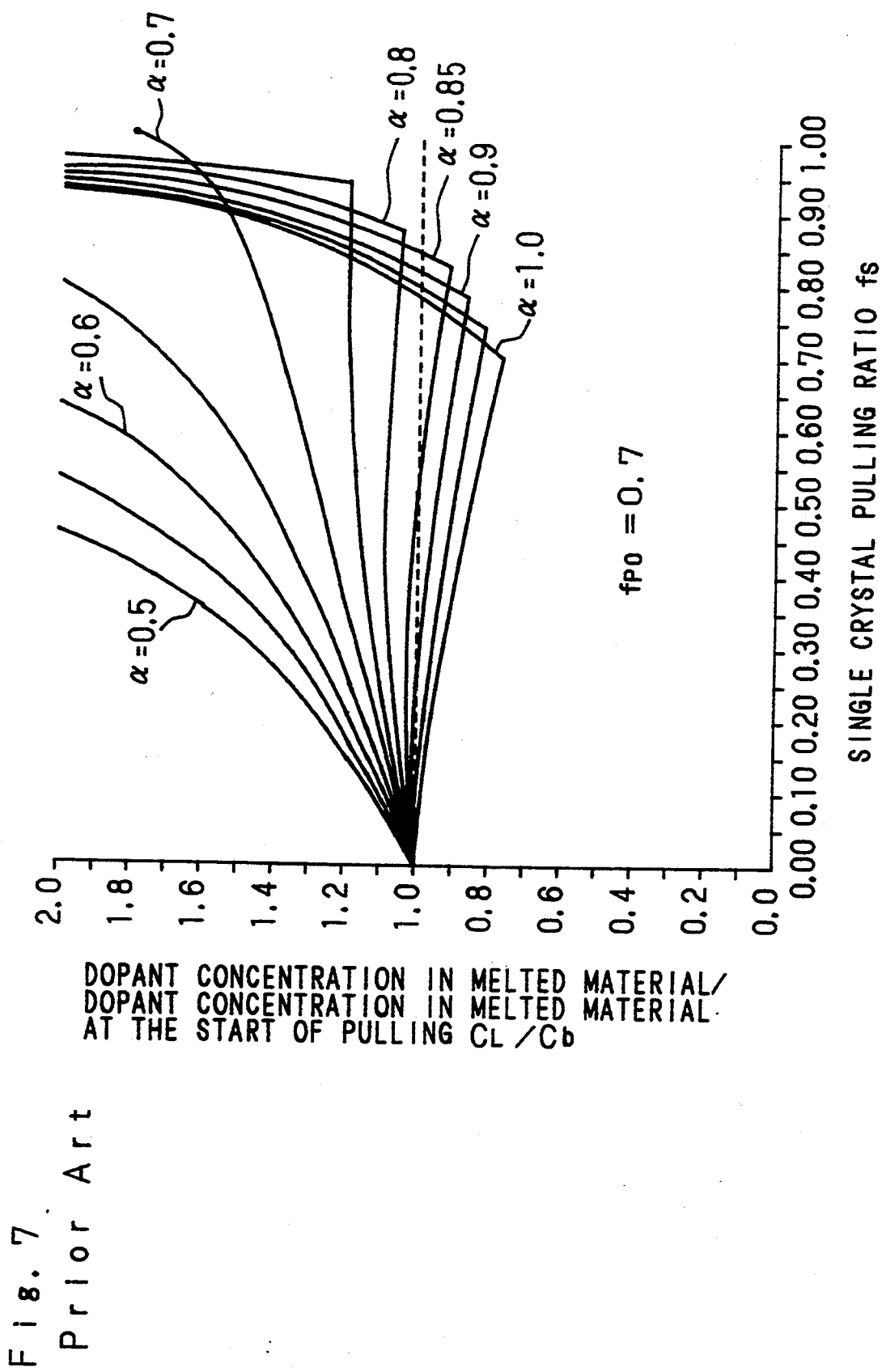
FIG. 7 is a graph for determining the change in dopant concentration when $ke=0.35$ and $f_{p0}=0.7$.
Figure 8:
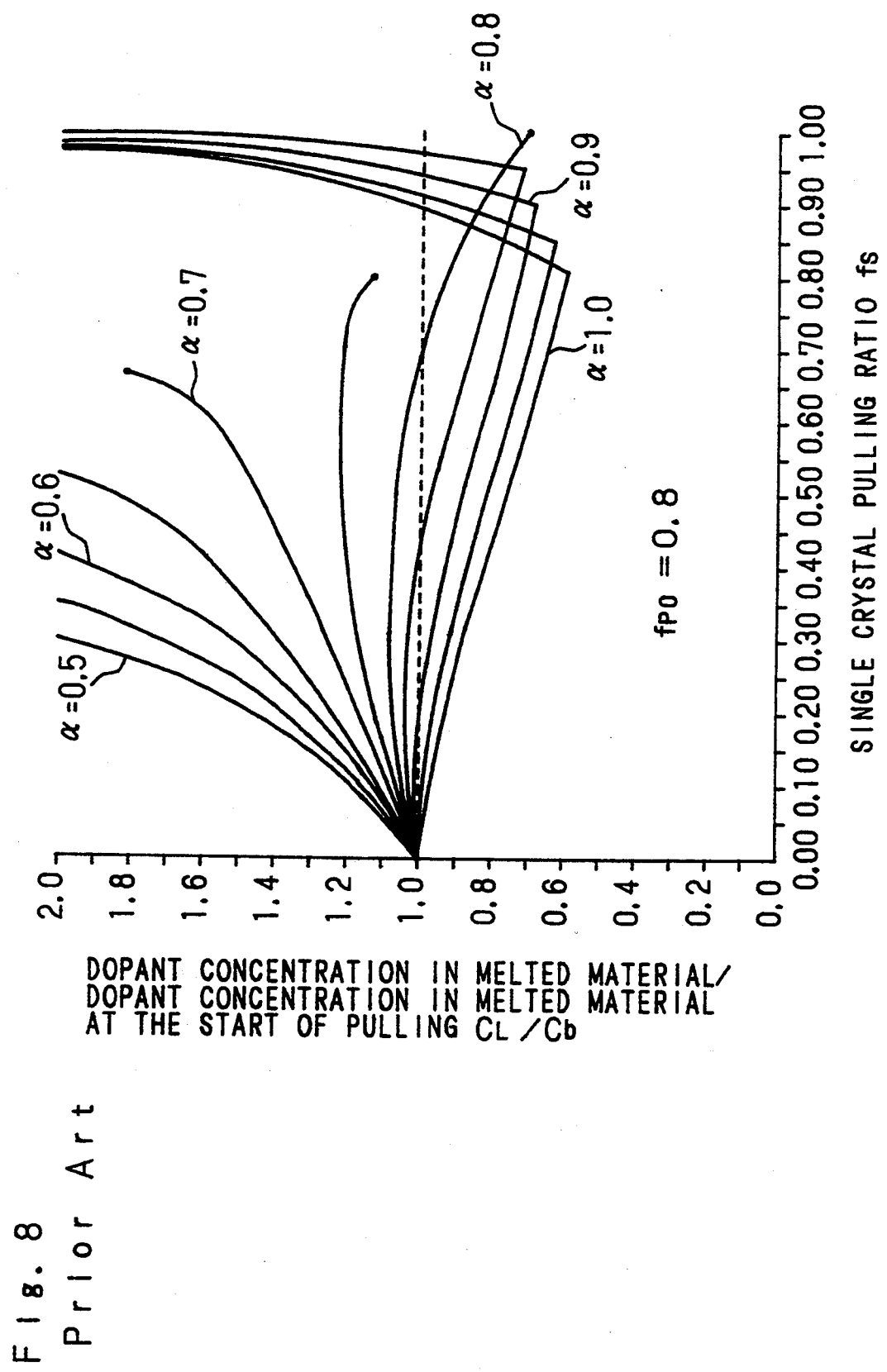
FIG. 8 is a graph for determining the change in dopant concentration when $ke=0.35$ and $f_{p0}=0.8$.
Figure 9:
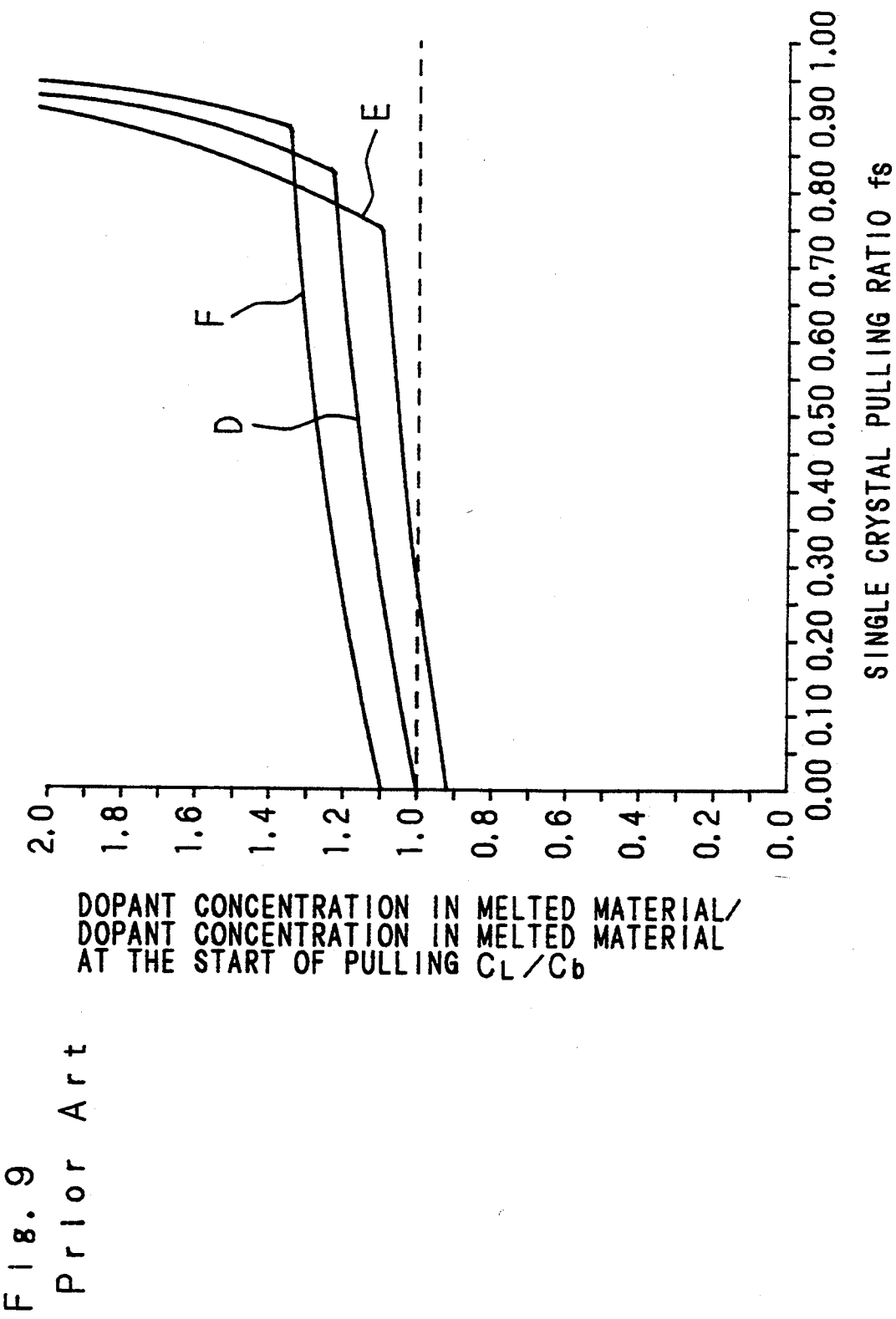
FIG. 9 is a graph for determining the change in dopant concentration when $f_{p0}=0.55$, 0.6 or 0.65.
Figure 10:
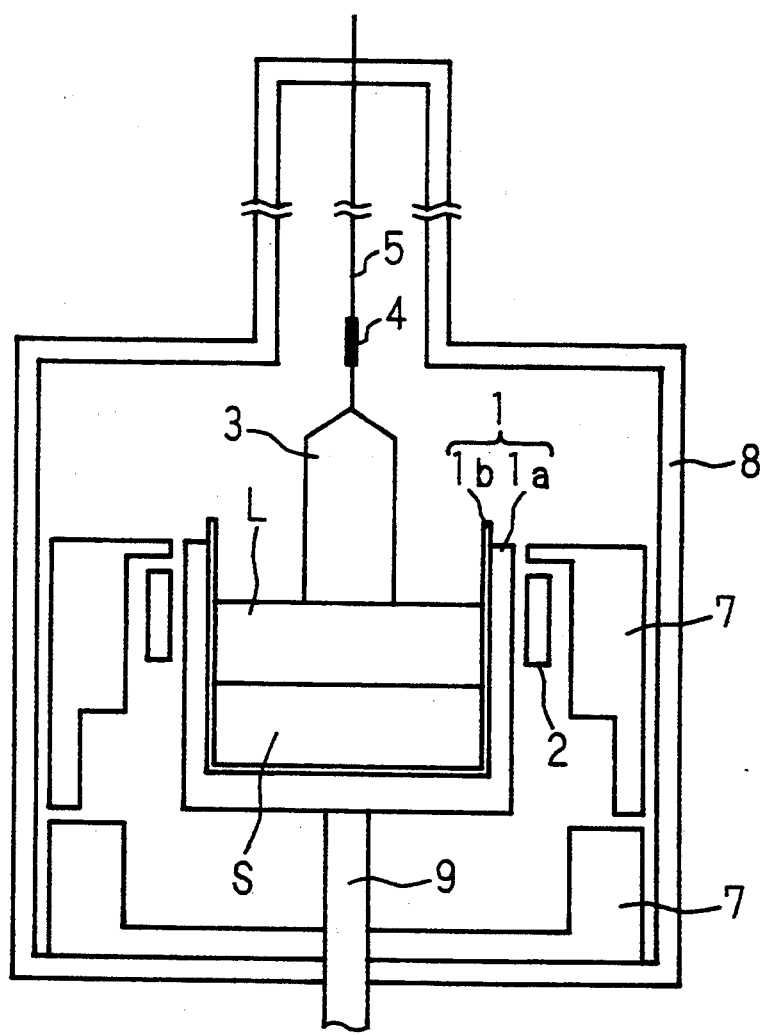
FIG. 10 is a schematic cross-sectional view of a single crystal growing apparatus according to an embodiment of the present invention.

FIG. 10 is a schematic cross-sectional view of a single crystal growing apparatus used for an embodiment of the present invention. In FIG. 10, reference numeral 1 designates a crucible arranged within a water-cooled chamber 8. The crucible 1 includes a quartz inner case 1b in the shape of bottomed cylinder and a graphite outer case 1a which is fitted on the outside of the inner case 1b. A heater 2 is concentrically arranged on the outside of the upper part of the crucible 1. Heat shields 7, 7 are provided further on the outside of the heater 2. A shaft 9 is coupled to the central part of the bottom of the crucible 1 through the bottom of the chamber 8. The crucible 1 is adapted to move up and down while being rotated by the shaft 9. A wire 5 connected in an upper part of the chamber 8 is introduced into the chamber 8, and a seed crystal 4 is secured at the lower end of the wire 5.

First, the crucible 1 is filled with a material of single crystal. The whole material of single crystal thus filled is heated and melted by the heater 2. A dopant is added to the melted material and mixed uniformly. A solid layer S is coagulated upward from the bottom of the crucible 1, and the heater 2 is so controlled that the solid layer S and the melted layer L coexist with each other in the lower and upper parts, respectively, in the crucible 1. The solid layer S is melted at a fixed rate, while immersing the seed crystal 4 sufficiently in the melted layer L, after which the seed crystal 4 is pulled upward while being rotated. In this way, a single crystal 3 is grown at the lower end of the seed crystal 4.

TABLE 1

| | |
|---|---|
| Pulled crystal | 6 in. in dia, 1000 mm long, P doping |
| Crystal material | Polycrystal Si |
| Quartz crucible | 16 in. in dia, 14 in. high, round bottom |
| Heating | DC resistance heating |
| Heater | 460 mm in inner dia. by 508 mm in outer dia. by 150 mm high |

A silicon single crystal 3 is grown with the solid layer ratio at the start of pulling $f_{p0}$ at 0.6 and the melted layer melting rate $\alpha$ at 0.9. Test pieces were cut out at pitches of 100 mm from the uppermost part of the single crystal 3, and the electrical resistivity $\rho$ thereof was measured. The electrical resistivity $\rho$ is inversely proportional to the dopant concentration Cs in the single crystal, and the relation therebetween is expressed as $$Cs \alpha 1/\rho \qquad (26)$$

Also, the dopant concentration in the single crystal and the dopant concentration in the melted material during the pulling of the crystal are given by equation (7). Assuming that the uppermost part of the single crystal 3 represents the starting point of pulling, equation (27) is obtained from equation (7) and (26).

$$C_L/Cb = \rho_0/\rho \qquad (27)$$

where $\rho_0$ is the electrical resistivity of single crystal at the time of starting pulling.

Figure 11:
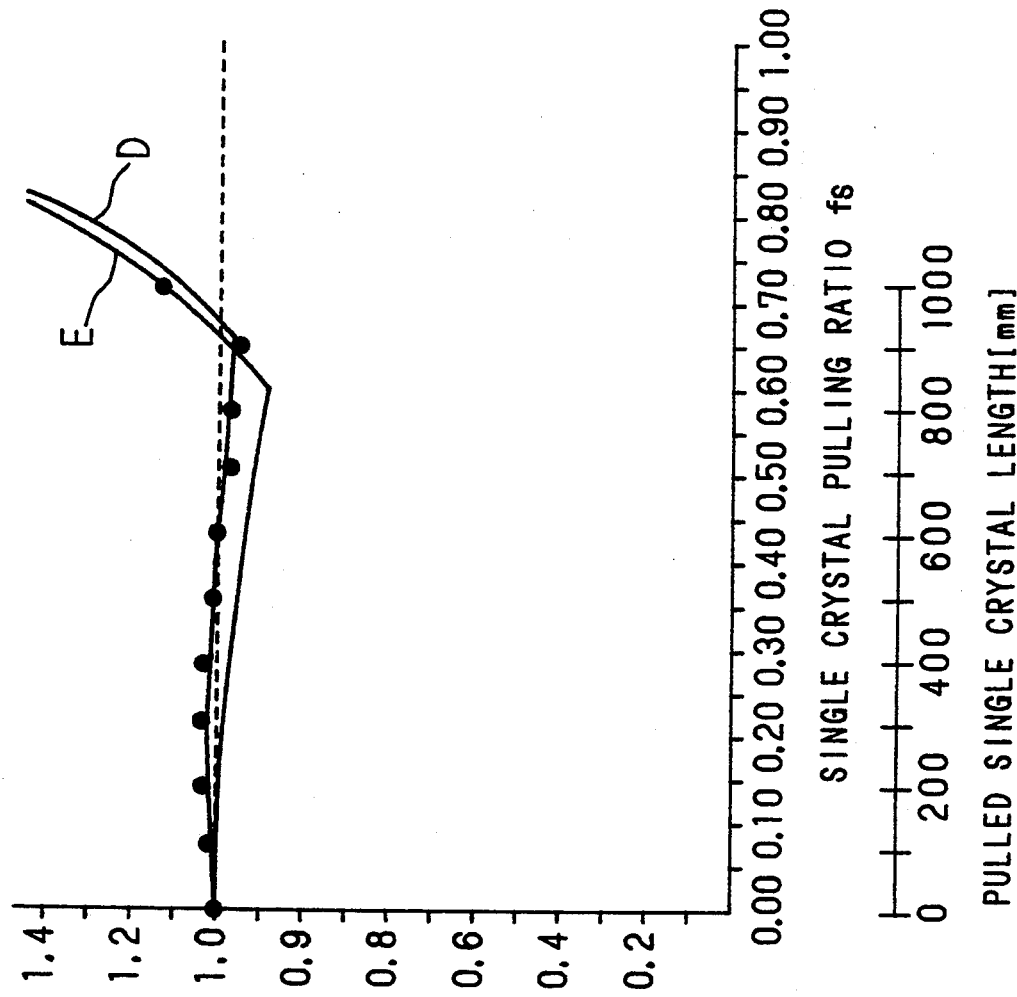
FIG. 11 is a graph showing the change in dopant concentration $C_L/Cb$ in the melted material according to the invention.

FIG. 11 is a graph showing the change of the dopant concentration $C_L/Cb$ in the melted material as normalized by the dopant concentration in the melted material at the start of pulling up the single crystal 3. From equation (27), the measurement $\rho_0/\rho$ of electrical resistivity of the test piece of silicon single crystal 3 is indicated by as $C_L/C_b$. Character D in FIG. 11 designates equation (23) descriptive of the change in dopant concentration for the effective segregation coefficient ke of 0.35 of the silicon single crystal against phosphorus, the solid layer ratio at the start of pulling $f_{p0}$ of 0.6 and the solid layer melting rate $\alpha$ of 0.9. Character E in FIG. 11 represents equation (22) descriptive of the change in dopant concentration in the melted material for the constant-thickness melted layer method with the effective segregation coefficient ke against phosphorus of the silicon single crystal at 0.35, the solid layer ratio at the start of pulling $f_{p0}$ at 0.6 and the solid layer melting rate $\alpha$ at 1.0.

As apparent from FIG. 11, the silicon single crystal 3 is such that the change in dopant concentration in the melted layer during growth is suppressed more than when single crystal is grown by the constant-thickness melted layer method with dopant contained in the solid layer. Also, the change of dopant concentration in the melted material with the pulling ratio of the silicon single crystal 3 is seen to coincide substantially with equation (23) descriptive of the change in dopant concentration according to the variable-thickness melted layer method with the dopant contained in the solid layer.

Although single crystal is grown with the solid layer ratio at the start of pulling $f_{p0}$ at 0.6 and the solid layer melting rate $\alpha$ at 0.9 according to the embodiment, the invention is not limited to such an embodiment. Actually, single crystal is grown with the solid layer ratio at the start of pulling $f_{p0}$ in the range of 0.3 to 0.6 and the solid layer melting rate $\alpha$ in the range of 0.6 to 1.0.

[Embodiment 2]

(Example 1)

Figure 12:
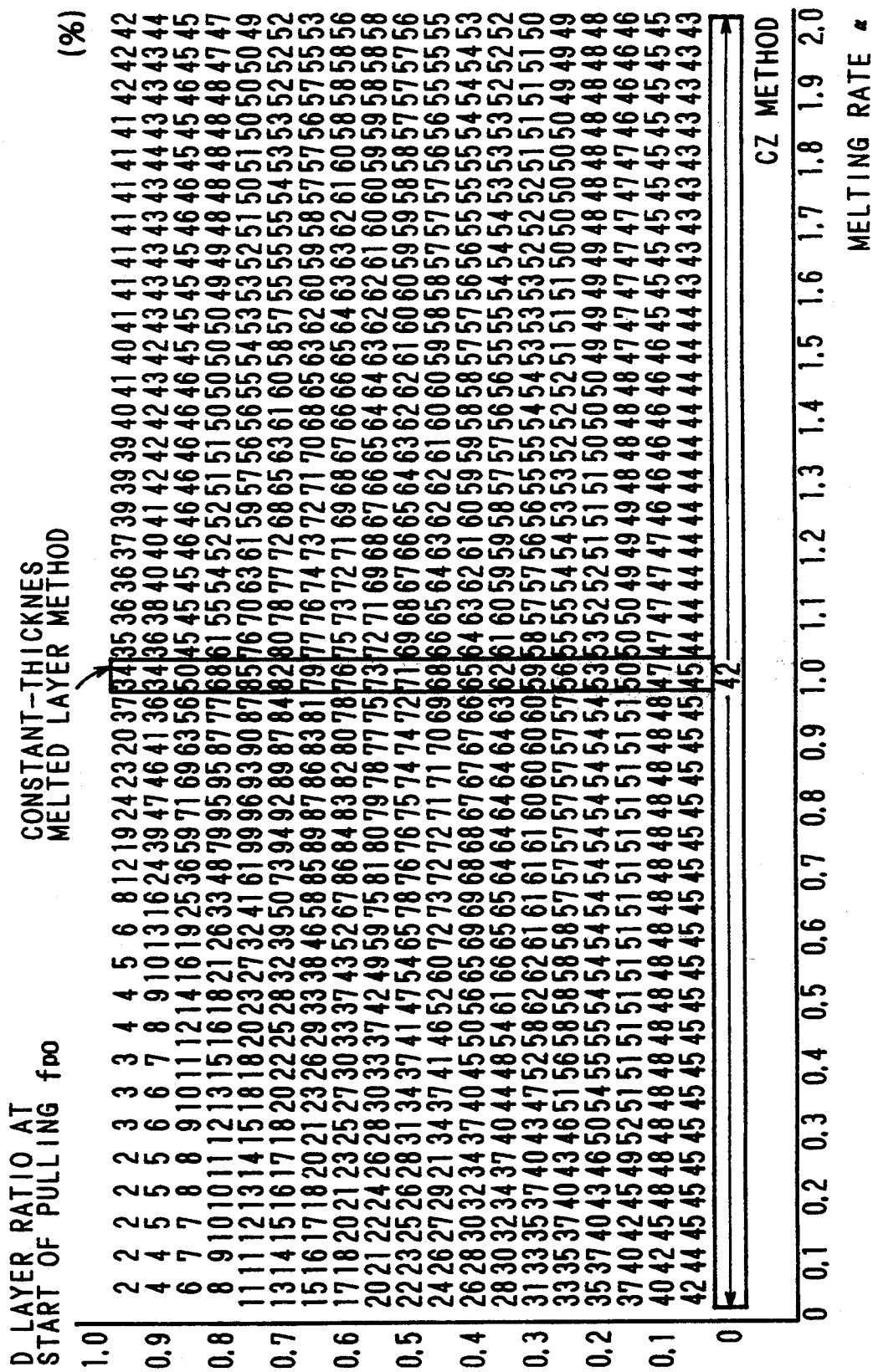
FIG. 12 is a diagram for explaining the yield with silicon single crystal grown as shown by Example 1 of Embodiment 2.

FIG. 12 is a diagram for explaining the calculation procedure of the yield of growing the silicon single crystal 3 according to Embodiment 1. The abscissa represents the melting rate $\alpha$, and the ordinate the solid layer ratio at the start of pulling $f_{p0}$. In Embodiment 1, the solid layer ratio at the start of pulling $f_{p0}$ is set to the range of 0 to 1 in 0.1 increments, and the melting rate $\alpha$ to the range of 0 to 2 in 0.1 increments. The dopant concentration in the melted material with silicon single crystal grown by doping phosphorus is calculated for each case by resolving equation (23) and (22) numerically. As explained above, the electrical resistivity $\rho$ of the single crystal and the dopant concentration Cs in the melted material (single crystal) are inversely proportional to each other (See equation (7) and (27). Also, the ratio between the upper and lower limits of the dopant concentration in the melted material coincides with the ratio between the lower and upper limits of the allowable range of electrical resistivity of the silicon single crystal. Therefore, the yield of silicon single crystal is calculated by setting the ratio between the lower and upper limits of the allowable range of electrical resistivity of the silicon single crystal at 0.7 to 1.

In FIG. 12, the yield according to the CZ method is shown when the solid layer ratio at the start of pulling $f_{p0}$ is zero, together with the yield according to the constant-thickness melted layer method when the melting rate $\alpha$ is 1. From FIG. 12, a region $X_1$ of the melting rate $\alpha$ where the yield is higher than in the constant-thickness melted layer method, i.e., when the melting rate $\alpha$ is unity, is determined for the single crystal grown with the solid layer ratio at the start of pulling $f_{p0}$. A region $Y_1$ where the yield is higher than 42% for the CZ method is also defined.

Figure 13:
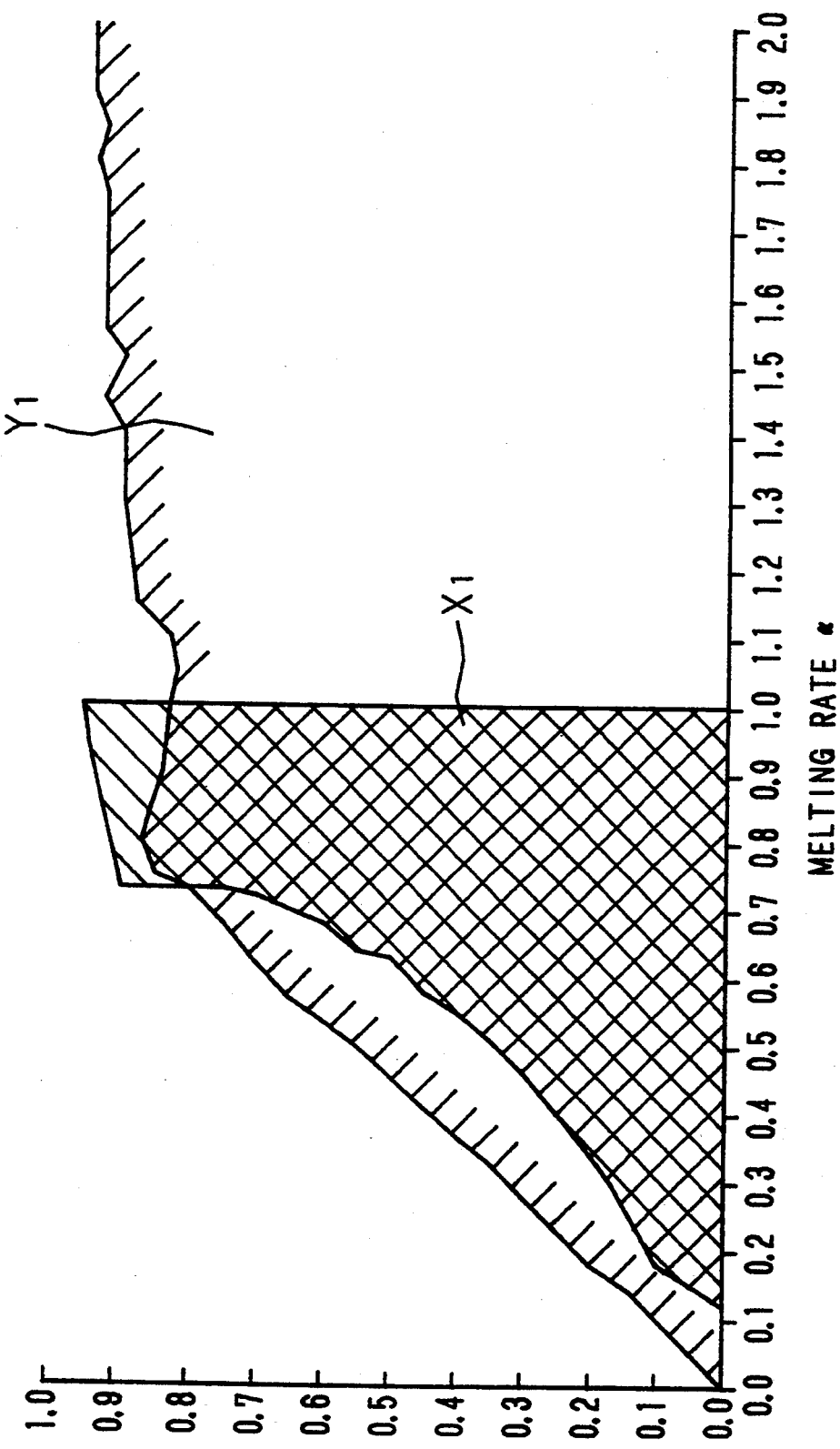
FIG. 13 is a graph showing the region where the yield is higher than in the constant-thickness melted layer method in Example 1 of Embodiment 2.

A graph proposing the regions $X_1$ and $Y_1$ is shown in FIG. 13. The range shared by the regions $X_1$ and $Y_1$ is considered to assume values $f_{p0}$ and $\alpha$ in the region defined by the function $f_{p0} = 14.9\alpha^4 - 18.3\alpha^3 + 7.98\alpha^2 - 0.90\alpha + 0.08$, the function $f_{p0} = 0$, the function $f_{p0} = 0.85$ and the function $\alpha = 1$. This region does not contain any boundary, and $\alpha$ is a positive real number.

Under these conditions of $f_{p0}$ and $\alpha$, silicon single crystal with the lower and upper limits of the allowable limit of electrical resistivity in the ratio of 0.7 to 1 can be grown with a yield improved as compared with the constant-thickness melted layer method.

(Example 2)

As a result of determining in similar fashion the yield for the silicon single crystal 3 with the lower and upper limits of the allowable range of electrical resistivity in the ratio of 1 to 1.3, the region of $f_{p0}$ and $\alpha$ where silicon single crystal grows with an improved yield over the constant-thickness melted layer method was substantially the same as that in the ratio of 1 to 1.3.

Figure 14:
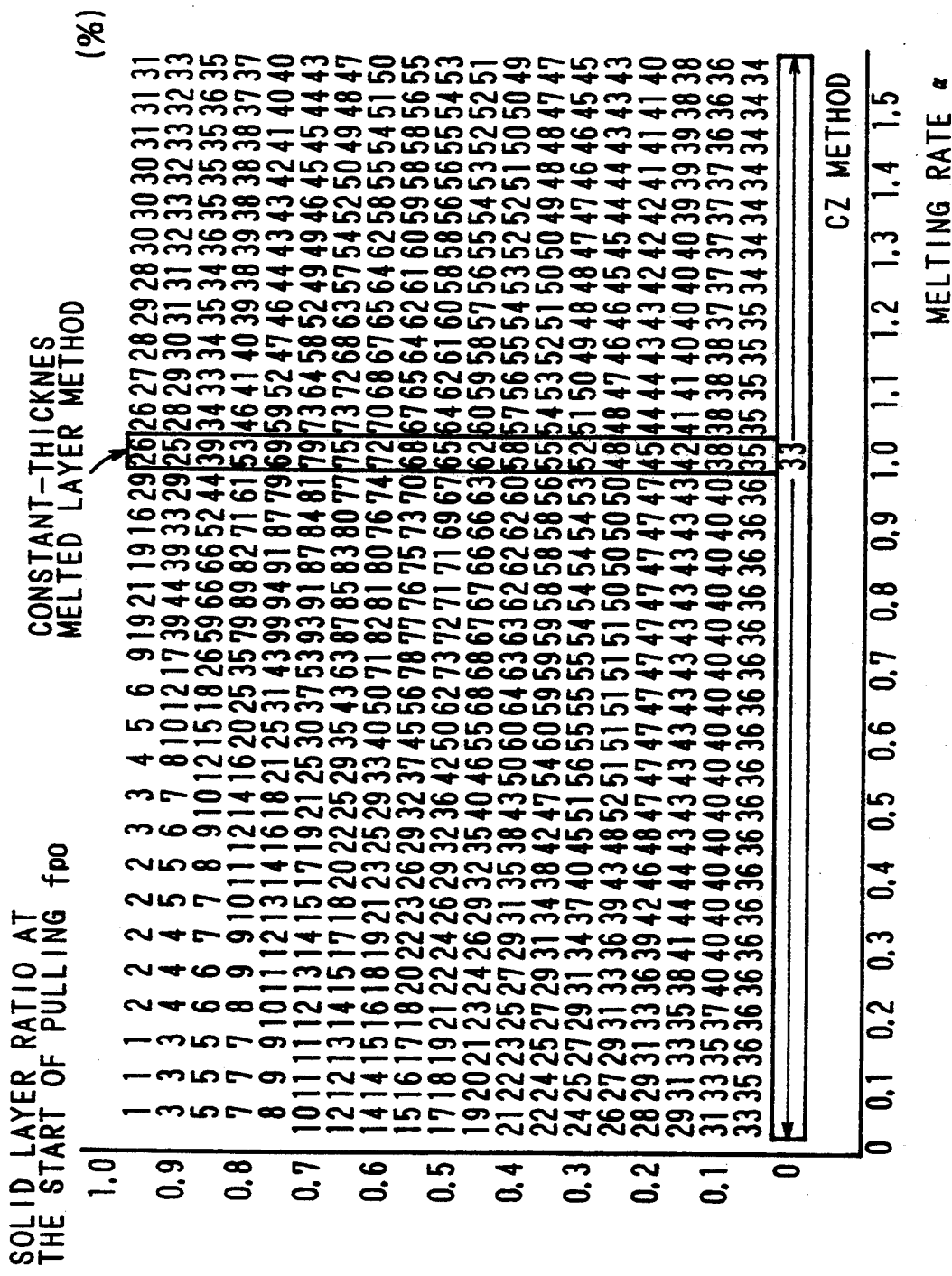
FIG. 14 is a diagram for explaining the yield with silicon single crystal grown as shown by Example 2 of Embodiment 2.

The yield of growing the silicon single crystal 3 will be described with reference to the case where the lower and upper limits of the allowable range of electrical resistivity of the silicon single crystal 3 are in the ratio of 1 to 1.3. FIG. 14 is a diagram for explaining the yield of growing the silicon single crystal 3 in the case where the lower and upper limits of the allowable range of electrical resistivity of the silicon single crystal are in the ratio of 1 to 1.3. The abscissa represents the melting rate $\alpha$ and the ordinate the solid layer ratio at the start of pulling $f_{p0}$. In a manner similar to FIG. 12, the region $X_2$ of the melting rate $\alpha$ higher in yield than the constant-thickness melted layer method is determined, and so is determined the region $Y_2$ having a yield higher than 33% for the CZ method.

Figure 15:
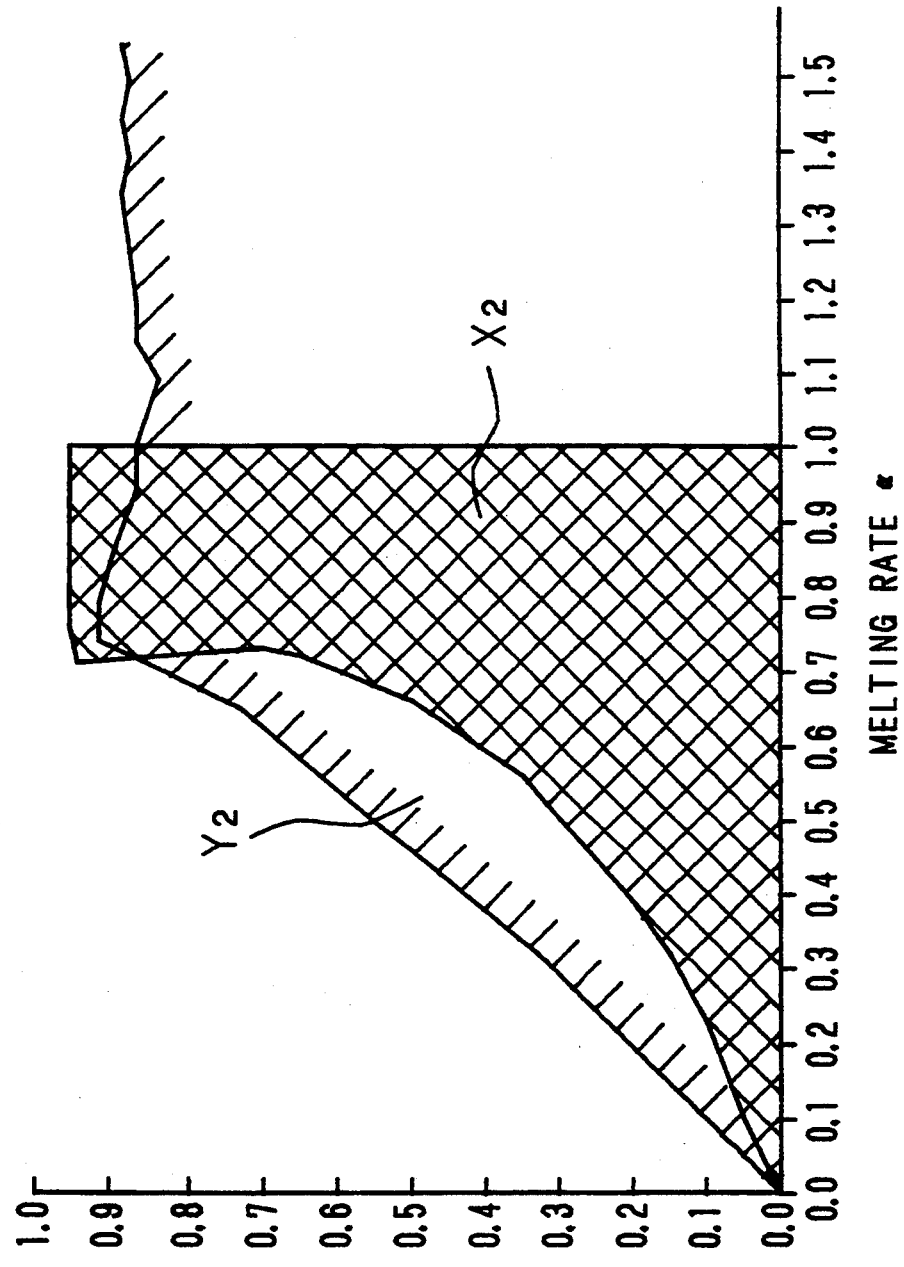
FIG. 15 is a graph showing the region where the yield is higher than in the constant-thickness melted layer method in Example 2 of Embodiment 2.

A graph proposing the regions $X_2$ and $Y_2$ is shown in FIG. 15. The range shared by the regions $X_2$ and $Y_2$ is considered to assume the values $f_{p0}$ and $\alpha$ for the region defined by the function $f_{p0} = 136.27\alpha^2 - 263.28\alpha^4 + 191.07\alpha^3 - 62.46\alpha^2 + 9.26\alpha - 0.42$, the function $f_{p0} = 0$, the function $f_{p0} = 0.85$ and the function $\alpha = 1$. This region contains no boundary, and $\alpha$ is a positive real number. Under these conditions of $f_{p0}$ and $\alpha$, the silicon single crystal with the lower and upper limits of the allowable range of electrical resistivity in the ratio of 1 to 1.3 can be grown with an improved yield against electrical resistivity as compared with the constant-thickness melted layer method.

[Embodiment 3]

(Example 1)

Figure 16:
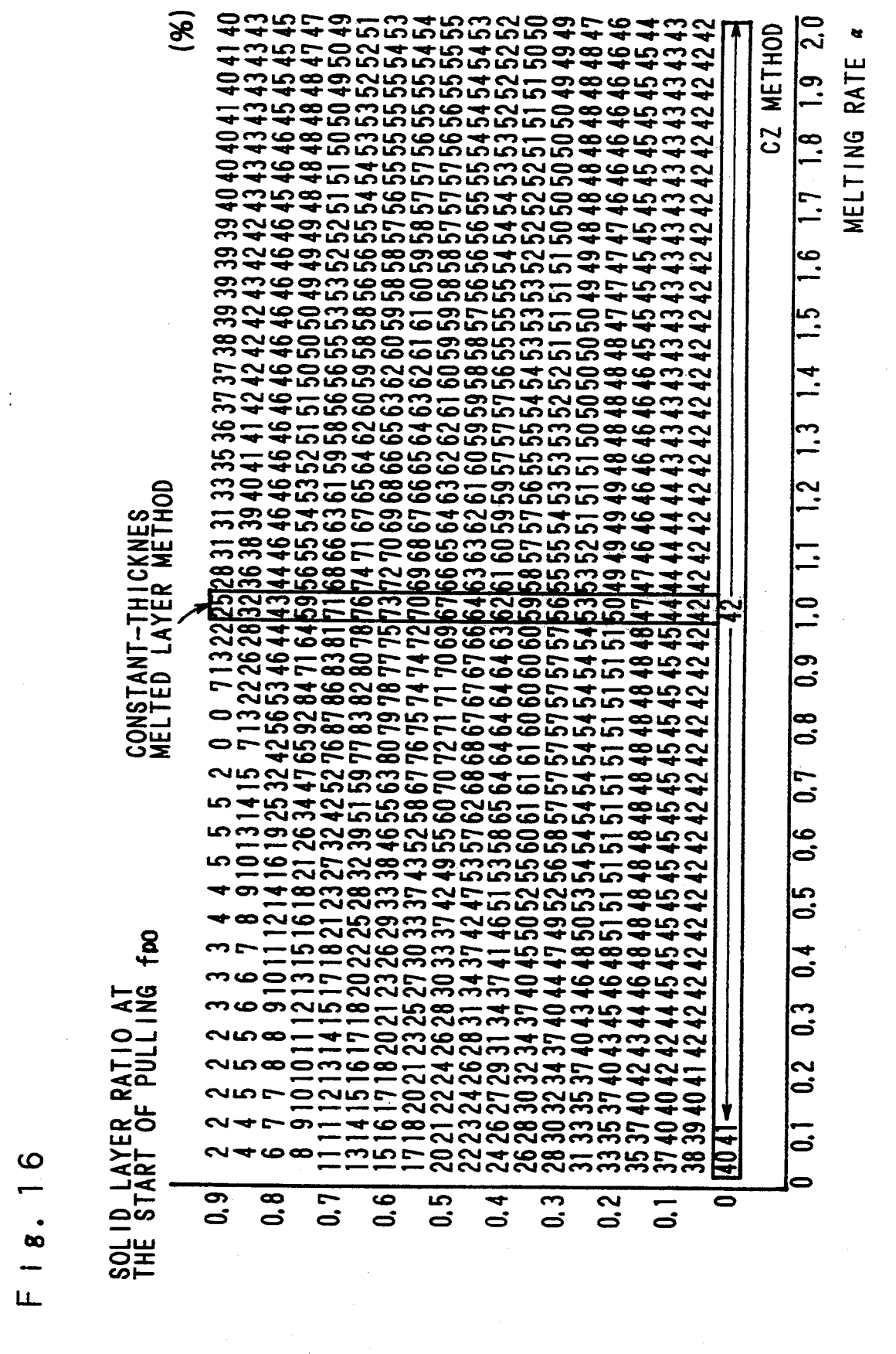

FIG. 16 is a diagram for explaining the manner in which the yield of growing the silicon single crystal 3 is calculated from equation (26) taking initial variations of solid layer ratio into consideration according to Embodiment 1. The abscissa represents the melting rate $\alpha$, and the ordinate the solid layer ratio at the start of pulling $f_{p0}$. In Embodiment 1, the solid layer ratio at the start of pulling $f_{p0}$ is set to the range of 0 to 1 in 0.1 increments, and the melting rate $\alpha$ to the range of 0 to 2 in 0.1 increments. The dopant concentration in the melted material with silicon single crystal grown by doping phosphorus in each case is calculated by resolving equations (23) and (22) numerically. And the yield of single crystal 3 with the lower and upper limits of the allowable range of electrical resistivity in the ratio of 0.7 to 1 is calculated from equation (24).

In FIG. 16, the yield for the CZ method is indicated where the solid layer ratio at the start of pulling $f_{p0}=0$, and the yield for the constant-thickness melted layer method where the melting rate $\alpha$ is 1. From these diagrams, the regions $X_3$ and $X_{31}$ of the melting rate $\alpha$ higher in yield than the constant-thickness melted layer method are defined for the single crystal grown with the same solid layer ratio at the start of pulling $f_{p0}$. The region $Y_3$ with a yield higher than 42% for the CZ method is also determined.

Figure 17:
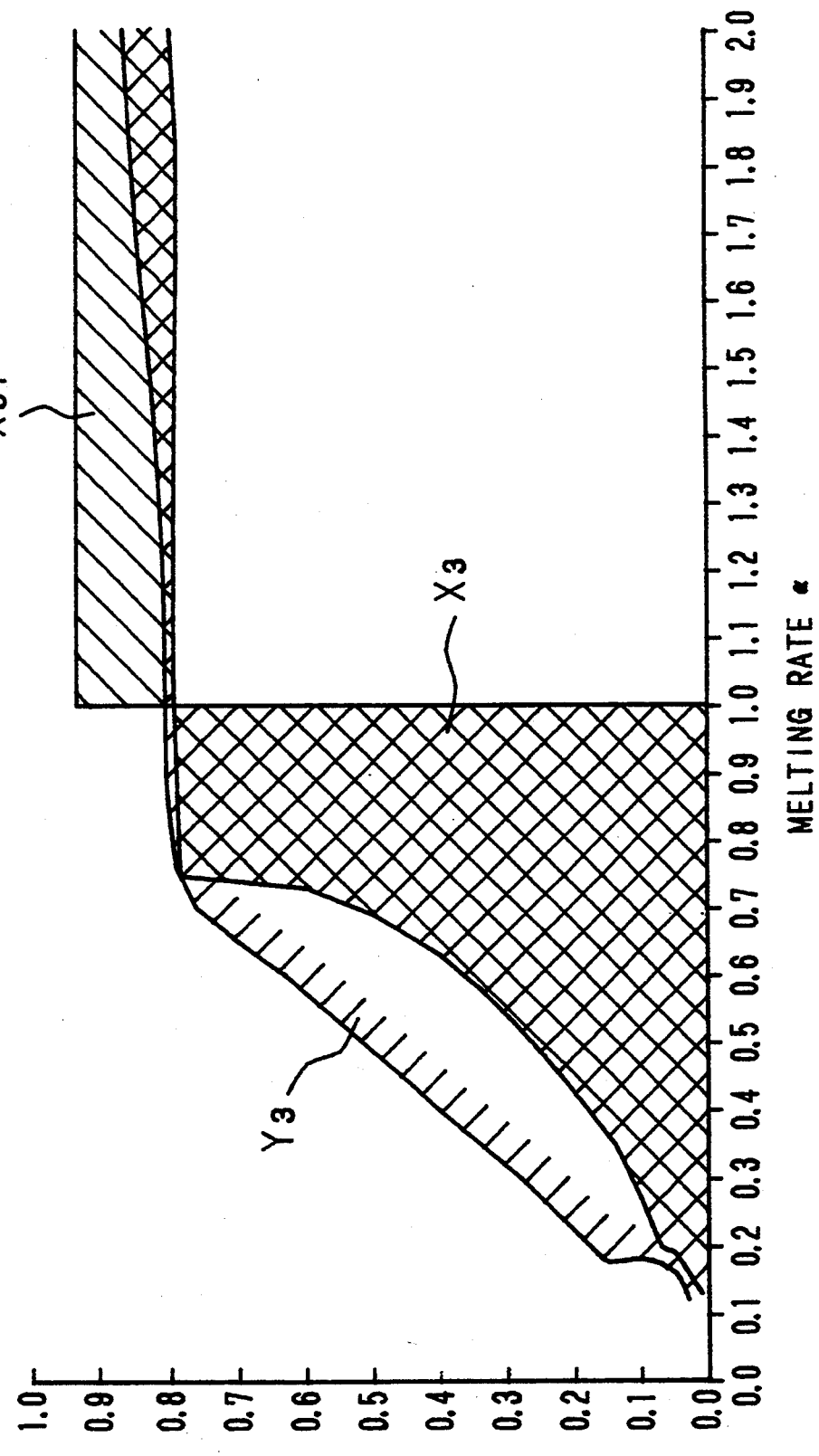
FIG. 17 is a graph showing the region where the yield is higher than in the constant-thickness melted layer method in Example 1 of Embodiment 3.

FIG. 17 is a graph proposing the regions $X_3$, $X_{31}$ and $Y_3$. The range shared by the regions $X_3$ and $Y_3$ is considered to be given by $f_{p0}$ and $\alpha$ defined by the function $f_{p0}=0.65-\{(\alpha-3.1187)^2-5.614\}^{\frac{1}{2}}/8.1455^{\frac{1}{2}}$, the function $f_{p0}=0$, the function $f_{p0}=0.80$ and the function $\alpha=1$. No boundary is contained in this region, and $\alpha$ is a positive real number. The range shared by the regions $X_{31}$ and $Y_3$ has substantially the same yield as in the CZ method and is excluded.

Under these conditions of $f_{p0}$ and $\alpha$, silicon single crystal with the lower and upper limits of the allowable range of electrical resistivity in the ratio of 0.7 to 1 taking into consideration the initial variations in solid layer ratio can be grown with a yield against electrical resistivity improved over the constant-thickness melted layer method.

(Example 2)

Figure 18:
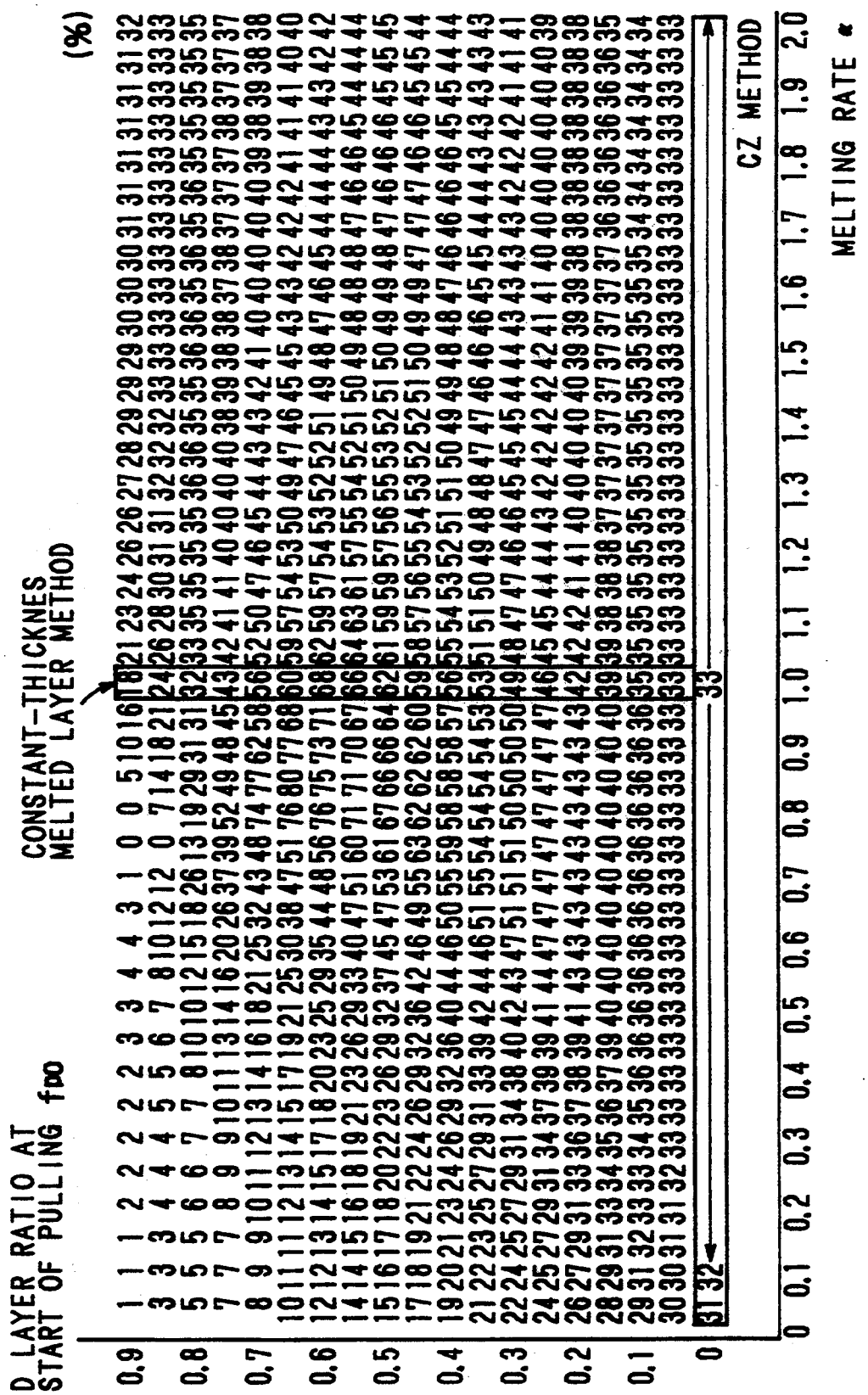
FIG. 18 is a diagram for explaining the yield with silicon single crystal grown as shown by Example 2 of Embodiment 3.

FIG. 18 is a diagram for explaining the manner in which the yield of growing the silicon single crystal 3 with the lower and upper limits of the allowable range of electrical resistivity in the ratio of 1 to 1.3 is calculated from equation (25) taking the initial variations of solid layer ratio into consideration according to Embodiment 1. The abscissa represents the melting rate $\alpha$, and the ordinate the solid layer ratio at the start of pulling $f_{p0}$. As in the case of FIG. 16, the regions $X_4$ and $X_{41}$ where the yield is higher than in the constant-thickness melted layer method are defined, and so is the region $Y_4$ with a yield improved over 33% for the CZ method.

A graph proposing the regions $X_4$, $X_{41}$ and $Y_4$ is shown in FIG. 19. The range shared by the regions $X_4$ and $Y_4$ is considered to be given by $f_{p0}$ and $\alpha$ defined by the function $f_{p0}=0.635-\{2.5975-(\alpha+0.83165)^2\}^{\frac{1}{2}}/4.1002^{\frac{1}{2}}$, the function $f_{p0}=0$, the function $f_{p0}=0.78$ and the function $\alpha=1$. No boundary is contained in this region, and $\alpha$ is a positive real number. The range shared by the regions $X_{41}$ and $Y_4$ has substantially the same yield as the CZ method and therefore is not included. Under these conditions of $f_{p0}$ and $\alpha$, silicon single crystal with the lower and upper limits of the allowable range of electrical resistivity in the ratio of 1 to 1.3 can be grown with a yield against electrical resistivity improved over the constant-thickness melted layer method taking variations in the solid layer ratio in initial stages into consideration.

Now, the silicon single crystal 3 is grown under the conditions specified in Table 2 with phosphorus as a dopant having the effective segregation coefficient ke of 0.35 by the use of the crystal growing apparatus shown in FIG. 10. Test pieces were cut out at 100-mm pitches in a range 1000 mm from the uppermost portion of the single crystal 3 with the solid layer ratio at the start of pulling $f_{p0}$ of 0.6 and the solid layer melting rate $\alpha$ of 0.9, and the electrical resistivity $\rho$ of the particular test pieces was measured.

TABLE 2

| | |
|---|---|
| Pulled crystal | 6 in. in dia., N-type silicon |
| Crystal material | High-purity polycrystal silicon, 60 kg |
| Heating method | DC resistance heating |
| Environment in chamber | 10 Torr, Ar (40 liter/min) |
| Quartz crucible | 16 in. in dia. by 14 in. high |
| Heater | 460 mm in inner dia. by 508 mm in outer dia. by 150 mm high |
| Heat shield | 600 mm in inner dia. by 800 mm in outer dia. |
| Chamber | 845 mm in dia. by 600 mm high |

Calculations of the yield on the basis of the electrical resistivity $\rho$ show that the yield is 75% in the case where the ratio between lower and upper limits of the allowable range of electrical resistivity is 1 to 1.3. This is a value intermediate the calculated yield value of 76% for the solid layer ratio at the start of pulling ideally realized (FIG. 12) and the calculated yield value of 73% taking variations in the solid layer ratio at the start of pulling $f_{p0}$ into consideration. The yield is 78% when the lower and upper limits of the allowable range of electrical resistivity are in the ratio of 0.7 to 1. This is also a value intermediate the calculated yield with an ideally-realized solid layer ratio at the start of pulling $f_{p0}$ and the yield taking variations into consideration.

A similar result is obtained for the measurement taken under other conditions of the solid layer ratio at the start of pulling $f_{p0}$ and the solid layer melting rate $\alpha$. As a result, crystal can be grown under the conditions specified in FIGS. 17 or 19 with the yield against electrical resistivity improved over the constant-thickness melted layer method.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A method of growing a single crystal, comprising the steps of:
    filling a single crystal silicon material in a crucible;
    melting the whole single crystal silicon material filled and adding phosphorus doping impurities to the single crystal material;
    forming a solid layer coagulated from the bottom of the crucible and a melted layer over the solid layer; and
    melting the solid layer from the upper side thereof and pulling up the single crystal from the melted layer while changing the volume of the melted layer wherein $f_{p0}$ is a ratio by weight of the solid layer at the beginning of the pulling up step compared to a total amount of the single crystal material in the crucible;
    the step of forming a solid layer including the substep of forming a solid layer with the ratio of $f_{p0}$ by weight to the single crystal material at the start of growing single crystal, and the step of growing single crystal including the substep of melting the solid layer $\alpha$ times greater in weight than the grown single crystal, the values $f_{p0}$ and $\alpha$ meeting the following conditions:

$$0 < f_{p0} < 0.85$$

$$f_{p0} < 14.9\alpha^4 - 18.3\alpha^3 + 7.89\alpha^2 - 0.90\alpha + 0.08$$

$$0 < \alpha < 1.$$

2. A method of growing a single crystal, comprising the steps of:
  filling a single crystal silicon silicon material in a crucible;
  melting the whole single crystal material filled and adding phosphorus doping impurities to the single crystal material;
  forming a solid layer coagulated from the bottom of the crucible and a melted layer over the solid layer; and
  melting the solid layer from the upper side thereof and pulling up the single crystal from the melted layer while changing the volume of the melted layer wherein $f_{p0}$ is a ratio by weight of the solid layer at the beginning of the pulling up step compared to a total amount of the single crystal material in the crucible;
  the step of forming a solid layer including the substep of forming a solid layer with the ratio of $f_{p0}$ by weight to the single crystal material at the start of growing single crystal, and the step of growing single crystal including the substep of melting the solid layer $\alpha$ times greater in weight than the grown single crystal, the values $f_{p0}$ and $\alpha$ meeting the following conditions:

$$0 < f_{p0} < 0.85$$

$$f_{p0} < 136.27\alpha^2 - 263.28\alpha^4 + 191.07\alpha^3 - 62.46\alpha^2 + 9.26\alpha - 0.42$$

$$0 < \alpha < 1.$$

3. A method of growing a single crystal, comprising the steps of:
  filling a single crystal silicon material in a crucible;
  melting the whole single crystal silicon material filled and adding phosphorus doping impurities to the single crystal material;
  forming a solid layer coagulated from the bottom of the crucible and a melted layer over the solid layer; and
  melting the solid layer from the upper side thereof and pulling up the single crystal from the melted layer while changing the volume of the melted layer wherein $f_{p0}$ is a ratio by weight of the solid layer at the beginning of the pulling up step compared to a total amount of the single crystal material in the crucible;
  the step of forming a solid layer including the substep of forming a solid layer with the ratio of $f_{p0} \pm 0.05$ by weight to the single crystal material at the start of growing single crystal, and the step of growing single crystal including the substep of melting the solid layer $\alpha$ times greater in weight than the grown single crystal, the values $f_{p0}$ and $\alpha$ meeting the following conditions:

$$0 < f_{p0} < 0.65 - \{(\alpha - 3.1187)^2 - 5.6104\}^{\frac{1}{2}} / 8.1455^{\frac{1}{2}}$$

and $$0 < \alpha < 0.75$$

or $$0 < f_{p0} < 0.8$$

and $$0.75 \leq \alpha 1.$$

4. A method of growing a single crystal, comprising the steps of:
  filling a single crystal silicon material in a crucible;
  melting the whole single crystal silicon material filled and adding phosphorus doping impurities to the single crystal material;
  forming a solid layer coagulated from the bottom of the crucible and a melted layer over the solid layer; and
  melting the solid layer from the upper side thereof and pulling up the single crystal from the melted layer while changing the volume of the melted layer wherein $f_{p0}$ is a ratio by weight of the solid layer at the beginning of the pulling up step compared to a total amount of the single crystal material in the crucible;
  the step of forming a solid layer including the substep of forming a solid layer with the ratio of $f_{p0} \pm 0.05$ by weight to the single crystal material at the start of growing single crystal, and the step of growing single crystal including the substep of melting the solid layer $\alpha$ times greater in weight than the grown single crystal, the values $f_{p0}$ and $\alpha$ meeting the following conditions:

$$0 < f_{p0} < 0.635 - \{2.5975 - (\alpha + 0.83165)^2\}^{\frac{1}{2}} / 4.1002^{\frac{1}{2}}$$

and $$0\alpha < 0.78$$

or $$0 < f_{p0} < 0.77$$

and $$0.78 \leq \alpha 1.$$

5. A method of growing a single crystal, comprising the steps of:
  filling a single crystal material in a crucible;
  melting the whole single crystal material filled and adding doping impurities to the single crystal material;
  forming a solid layer coagulated from the bottom of the crucible and a melted layer over the solid layer; and
  melting the solid layer from the upper side thereof and pulling up the single crystal from the melted layer while changing the volume of the melted layer wherein $f_{p0}$ is a ratio by weight of the solid layer at the beginning of the pulling up step compared to a total amount of the single crystal material in the crucible;
  the yield of the grown single crystal being calculated using the ratio $f_{p0}$ by weight of the solid layer to the single crystal material at the start of growing single crystal and the ratio $\alpha$ by weight of the melting solid layer to the growing single crystal as parameters, the conditions of $f_{p0}$ and $\alpha$ being set in such a manner that the calculated yield exceeds 33%, and single crystal is grown under the conditions so set.

6. A method of growing crystal according to claim 5, wherein:

silicon is used as the single crystal material, and phosphorus is employed as the doping impurities.

7. A method of growing crystal according to claim 6, wherein:

the upper and lower limits of the allowable range of electrical resistivity of the grown silicon single crystal are in the ratio of 0.7 to 1, and the yield of the silicon single crystal is calculated, the values $f_{p0}$ and $\alpha$ being set to meet the following conditions:

$0 < f_{p0} < 0.85$ $f_{p0} < 14.9\alpha^4 - 18.3\alpha^3 + 7.98\alpha^2 - 0.90\alpha + 0.08$ $0 < \alpha < 1.$ 8. A method of growing crystal according to claim 6, wherein:

the upper and lower limits of the allowable range of electrical resistivity of the grown silicon single crystal are in the ratio of 1 to 1.3, and the yield of the silicon single crystal is calculated, the values $f_{p0}$ and $\alpha$ being set to meet the following conditions:

$0 < f_{p0} < 0.85$ $f_{p0} < 136.27\alpha^2 - 263.28\alpha^4 + 191.07\alpha^3 - 62.46\alpha^2 + 9.26\alpha - 0.42$ $0 < \alpha < 1.$ 9. A method of growing a single crystal, comprising the steps of:

filling a single crystal material in a crucible;

melting the whole single crystal material filled and adding doping impurities to the single crystal material;

forming a solid layer coagulated from the bottom of the crucible and a melted layer over the solid layer; and melting the solid layer from the upper side thereof and pulling up the single crystal from the melted layer while changing the volume of the melted layer wherein $f_{p0}$ is a ratio by weight of the solid layer at the beginning of the pulling up step compared to a total amount of the single crystal material in the crucible;

the yield of the grown single crystal being calculated using the ratio $f_{p0} \pm 0.05$ by weight of the solid layer to the single crystal material at the start of growing single crystal and the ratio $\alpha$ by weight of the melting solid layer to the growing single crystal as parameters, the conditions of $f_{p0}$ and $\alpha$ being set in such a manner that the calculated yield exceeds 33%, and single crystal is grown under the conditions so set.

10. A method of growing crystal according to claim 9, wherein:

silicon is used as the single crystal material, and phosphorus is employed as the doping impurities.

11. A method of growing crystal according to claim 10, wherein:

the upper and lower limits of the allowable range of electrical resistivity of the grown silicon single crystal are in the ratio of 0.7 to 1, and the yield of the silicon single crystal is calculated, the values $f_{p0}$ and $\alpha$ being set to meet the following conditions:

$0 < f_{p0} < 0.65 - \{(\alpha - 3.1187)^2 - 5.6104\}^{\frac{1}{2}}/8.1455^{\frac{1}{2}}$ and $0 < \alpha < 0.75$ or $0 < f_{p0} < 0.8$ and $0.75 \leq \alpha < 1.$ 12. A method of growing crystal according to claim 10, wherein:

the upper and lower limits of the allowable range of electrical resistivity of the grown silicon single crystal are in the ratio of 1 to 1.3, and the yield of the silicon single crystal is calculated, the values $f_{p0}$ and $\alpha$ being set to meet the following conditions:

$0 < f_{p0} < 0.635 - \{2.5975 - (\alpha + 0.83165)^2\}^{\frac{1}{2}}/4.1002^{\frac{1}{2}}$ and $0 < \alpha < 0.78$ or $0 < f_{p0} < 0.77$ and $0.78 \leq \alpha < 1.$

* * * * *